US010591521B2

(12) United States Patent
Shon

(10) Patent No.: US 10,591,521 B2
(45) Date of Patent: *Mar. 17, 2020

(54) POWER MONITORING SYSTEM AND METHOD FOR MONITORING POWER THEREOF

(71) Applicant: LSIS CO., LTD., Gyeonggi-do (KR)

(72) Inventor: Sang-Ki Shon, Gyeonggi-do (KR)

(73) Assignee: LSIS CO., LTD., Anyang-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/254,869

(22) Filed: Sep. 1, 2016

(65) Prior Publication Data

US 2017/0059634 A1    Mar. 2, 2017

(30) Foreign Application Priority Data

Sep. 2, 2015  (KR) ........................ 10-2015-0124470

(51) Int. Cl.
*G01R 21/133* (2006.01)
*G01D 4/00* (2006.01)

(52) U.S. Cl.
CPC .......... *G01R 21/133* (2013.01); *G01D 4/004* (2013.01); *Y02B 70/346* (2013.01); *Y02B 90/242* (2013.01); *Y02B 90/245* (2013.01); *Y02B 90/248* (2013.01); *Y04S 20/322* (2013.01); *Y04S 20/40* (2013.01); *Y04S 20/52* (2013.01); *Y04S 20/525* (2013.01)

(58) Field of Classification Search
CPC ....... G01R 22/063; G01R 22/10; H02J 3/381; H02J 3/382; H02J 3/383; Y02B 70/3266; Y02B 70/3216; Y02B 90/246
See application file for complete search history.

(56) References Cited

U.S. PATENT DOCUMENTS

| 9,310,401 B2 | 4/2016 | Tsao et al. | |
| 2011/0133556 A1* | 6/2011 | Choi | H02J 3/383 |
| | | | 307/65 |
| 2012/0072141 A1* | 3/2012 | Hidai | G01R 19/2516 |
| | | | 702/60 |

(Continued)

FOREIGN PATENT DOCUMENTS

| CN | 106053934 A | 10/2016 |
| CN | 106405216 A | 2/2017 |

(Continued)

OTHER PUBLICATIONS

European Search Report dated Jan. 5, 2017 in corresponding European Application No. 16179736.0.

(Continued)

*Primary Examiner* — Jeff W Natalini
*Assistant Examiner* — Dustin R Dickinson
(74) *Attorney, Agent, or Firm* — K&L Gates LLP

(57) ABSTRACT

Disclosed embodiments relate to a power monitoring system that may include an external power supply source, an energy storage system and a distribution board. In some embodiments, the power monitoring system includes the external power supply source, the distribution board, the energy storage system, a first power metering device, a second power metering device, a third power metering device and a server.

13 Claims, 22 Drawing Sheets

(56) References Cited

U.S. PATENT DOCUMENTS

| | | | |
|---|---|---|---|
| 2012/0290230 A1* | 11/2012 | Berges Gonzalez | G01D 4/004 702/61 |
| 2012/0290232 A1 | 11/2012 | Kudo et al. | |
| 2014/0018969 A1* | 1/2014 | Forbes, Jr. | H02J 3/32 700/295 |
| 2014/0149056 A1* | 5/2014 | Lelkens | G01R 21/1333 702/61 |
| 2014/0222237 A1* | 8/2014 | Hibiya | H02J 3/14 700/295 |
| 2014/0316599 A1* | 10/2014 | Tomita | H04L 12/2823 700/295 |
| 2014/0365490 A1* | 12/2014 | Yang | G01D 1/14 707/737 |
| 2015/0249350 A1* | 9/2015 | Tomita | H01M 10/441 320/107 |
| 2015/0318700 A1* | 11/2015 | Inakagata | H02J 3/32 307/20 |

FOREIGN PATENT DOCUMENTS

| | | |
|---|---|---|
| EP | 2511716 A1 | 10/2012 |
| EP | 2701266 A1 | 2/2014 |
| EP | 3076134 A1 | 10/2016 |
| JP | 2002-345156 A | 11/2002 |
| JP | 2011-83085 A | 4/2011 |
| JP | 2012-29536 A | 2/2012 |
| JP | 2013-31236 A | 2/2013 |
| JP | 2013-213825 A | 10/2013 |
| JP | 2013-219935 A | 10/2013 |
| JP | 2014-39352 A | 2/2014 |
| JP | 2015033301 A | 2/2015 |
| KR | 20120003403 A | 1/2012 |
| KR | 20120136051 A | 12/2012 |
| KR | 20120138145 A | 12/2012 |
| KR | 20130002081 A | 1/2013 |
| KR | 20150025645 A | 3/2015 |
| KR | 20150031926 A | 3/2015 |
| WO | 2014141499 A1 | 9/2014 |

OTHER PUBLICATIONS

Office Action dated Jul. 11, 2017 issued in corresponding Japanese Application No. 2016-14281.

Chinese Office Action for related Chinese Application No. 201610727607.9; action dated Aug. 3, 2018; (10 pages).

\* cited by examiner

POWER MONITORING SYSTEM AND METHOD FOR MONITORING POWER THEREOF

CROSS REFERENCE TO RELATED APPLICATIONS

This application claims the benefit of Korean Patent Application No. 10-2015-0124470, filed on Sep. 2, 2015 and entitled "POWER MONITORING SYSTEM AND METHOD FOR MONITORING POWER THEREOF", which is hereby incorporated by reference in its entirety.

BACKGROUND

Technical Field

The present disclosure relates to a power monitoring system and a method for monitoring power thereof.

Description of the Related Art

With development of digital technology and network technology, consumer electronics and information devices have been developed to have various functions according to technology convergence/combination. Such digital multifunctional devices have come into wide use at home and offices. However, supporting functional convergence/combination and networking functions cause the consumer electronics and information devices to consume power by a user's request and standby power unnoticed by their users.

However, since users are not able to know how much power any specific one of their devices consumes over a specific period, they do not feel the need to save the electrical energy.

To address this problem, a technology to analyze and monitor the amount of power consumption and power consumption pattern of each electronic device over a specific period by means of a meter for measuring the total amount to power consumption per household and building in relation to monitoring of energy consumed by each electronic device has been introduced.

FIG. 1 is a block diagram of a conventional system for monitoring power consumed by loads.

Referring to FIG. 1, in the conventional system for monitoring power consumed by loads, the power supplied from an external power supply source 1 to each household 3 may be supplied to home appliances connected to receptacles via a distribution board 2 installed in each household 3. In particular, the distribution board 2 includes a power metering device 4 to check the power usage and the amount of power consumption of the home appliances in the household 3 which consume the power supplied from the external power supply source 1.

The aforementioned power metering device 4 may use the information about the power usage and power consumption patterns of the home appliances to monitor the home appliances individually through a remote server.

Recently, power generation sources or energy sources other than the external power supply source 1 have been increasingly used to supply power to home appliances in the household 3. Typical examples of the power generation sources or energy sources other than the external power supply source 1 may include an energy storage system.

The conventional system for monitoring power consumed by loads is incapable of detecting additional power supplied from an energy storage system connected thereto. Accordingly, it is not possible to comprehensively monitor power production and consumption in the household 3 in consideration of not only home appliances in the household but also the additional power supplied from the energy storage system and the power stored in the energy storage system.

SUMMARY

It is an aspect of some embodiments of the present disclosure to provide a power monitoring system capable of comprehensively monitoring the consumption state of power supplied to loads and the power production state of a renewable energy source when an energy storage system as well as the conventional external power supply source is provided and a method for monitoring power thereof.

In accordance with one aspect of some embodiments of the present disclosure, A power monitoring system includes an external power supply source configured to apply power, a distribution board configured to distribute power applied from the external power supply source to a first load, an energy storage system (ESS) configured to store the power applied from the external power supply source and to discharge the stored power to the distribution board, a first power metering device connected to an output of the external power supply source and configured to detect or determine first power data applied from the external power supply source, a second power metering device connected to an input of the distribution board and configured to detect or determine second power data distributed from the distribution board to the first load, a third power metering device connected to an input of the ESS and configured to detect or determine third power data applied to the ESS, and a server configured to monitor power based on at least one of the first power data, the second power data, and the third power data.

In accordance with another aspect of some embodiments of the present disclosure, a power monitoring system includes an external power supply source configured to apply power, a distribution board configured to distribute power applied from the external power supply source to at least one of a first load and an energy storage system (ESS), the energy storage system (ESS) connected to an output of the distribution board and configured to store the power distributed from the distribution board and to discharge the stored power, a first power metering device connected to an output of the external power supply source configured to detect or determine first power data applied from the external power supply source, a second power metering device connected to an input of the distribution board and configured to detect or determine second power data distributed from the distribution board to at least one of the first load and the ESS, a third power metering device connected to an input of the ESS and configured to detect third power data applied to the ESS, and a server configured to monitor power based on at least one of the first power data, the second power data, and the third power data.

DETAILED DESCRIPTION

Hereinafter, a power monitoring system and a method for a monitoring power in thereof according to embodiments of the present disclosure will be described in detail with reference to the accompanying drawings. It should be understood that the present disclosure is not limited to the following embodiments, and that some embodiments are provided for illustrative purposes only. The scope of the disclosure should be defined only by the accompanying claims and equivalents thereof.

Figure 1:
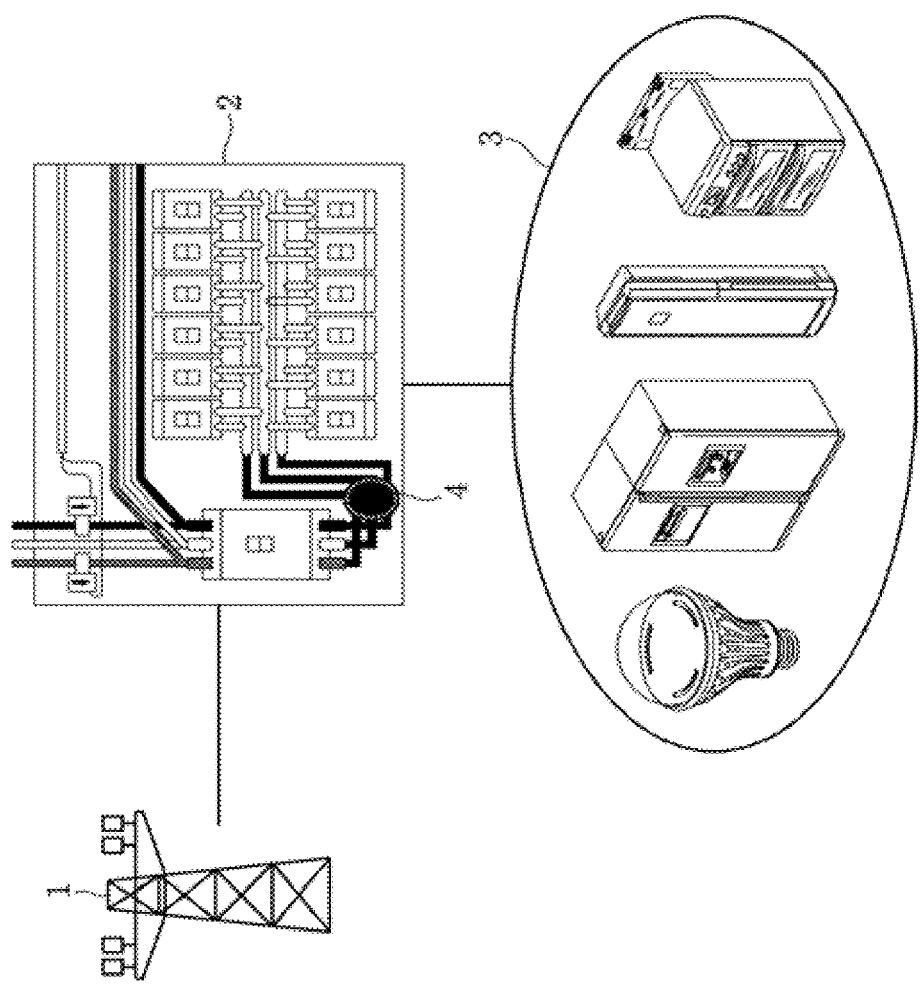
FIG. 1 is a block diagram illustrating a conventional system for monitoring power consumed by loads, according to the prior art.
Figure 2:
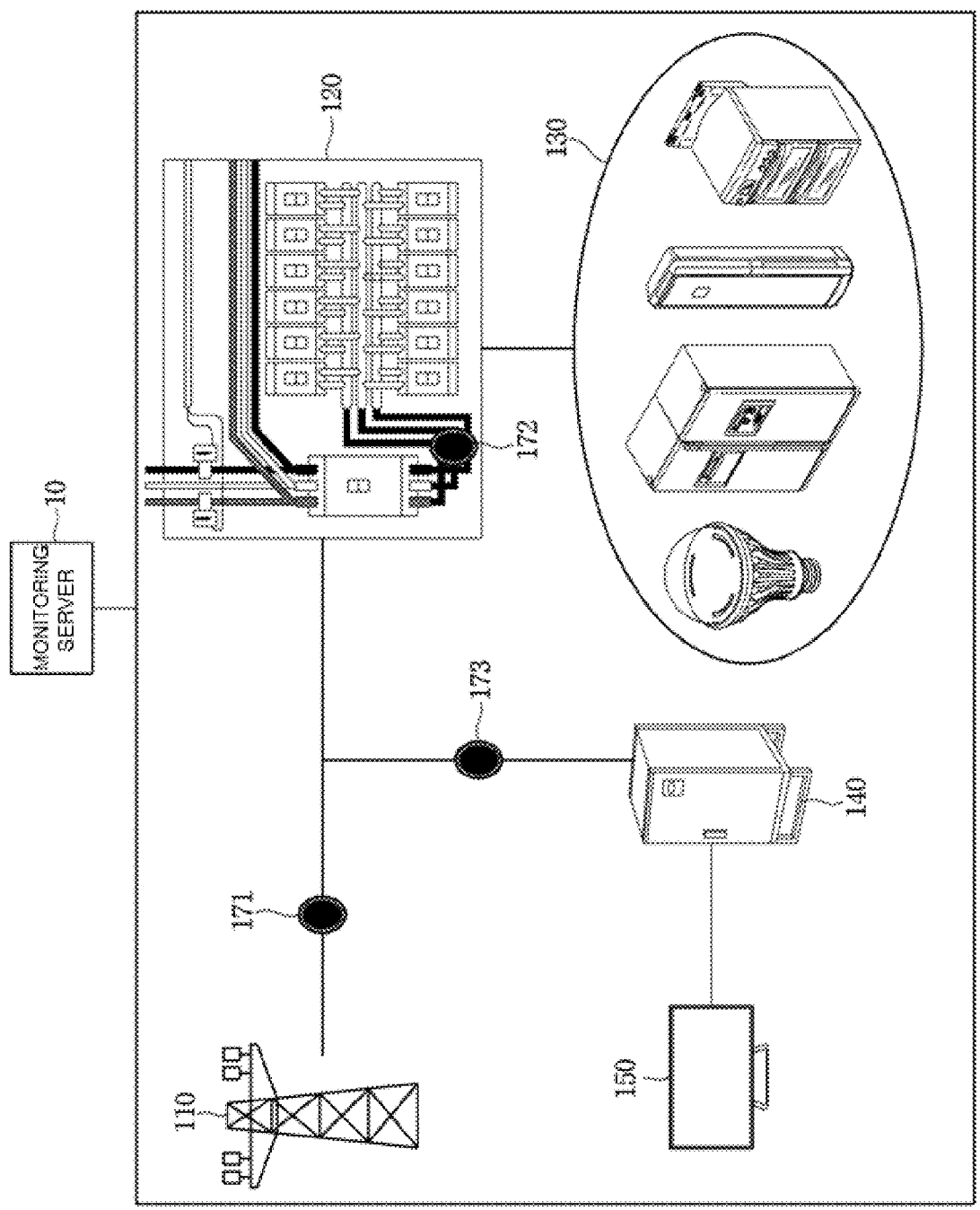
FIG. 2 is a block diagram illustrating a system for monitoring power consumed by loads in accordance with some embodiments of the present disclosure.

FIG. 2 is a block diagram illustrating a system for monitoring power consumed by loads in accordance with some embodiments of the present disclosure.

Referring to FIG. 2, the system for monitoring power consumed by loads according to some embodiments of the present disclosure includes a monitoring server 10, an external power supply source 110, a distribution board 120, a first load 130, an energy storage system (ESS) 140 and a second load 150. In particular, the outputs or inputs of the external power supply source 110, the distribution board 120 and the ESS 140 may include power metering devices 171, 172, and 173 respectively to detect power data input to or output from the aforementioned components.

The monitoring server 10 may obtain power data including the amounts of power consumption, applied power or power consumption patterns of loads and power sources measured by the power metering devices 171, 172 and 173.

In addition, the monitoring server 10 may monitor and output, based on the obtained data, the power supplied to the whole system, power consumption of the whole system, and power consumption and operational statuses of the individual loads in the system.

Figure 20:
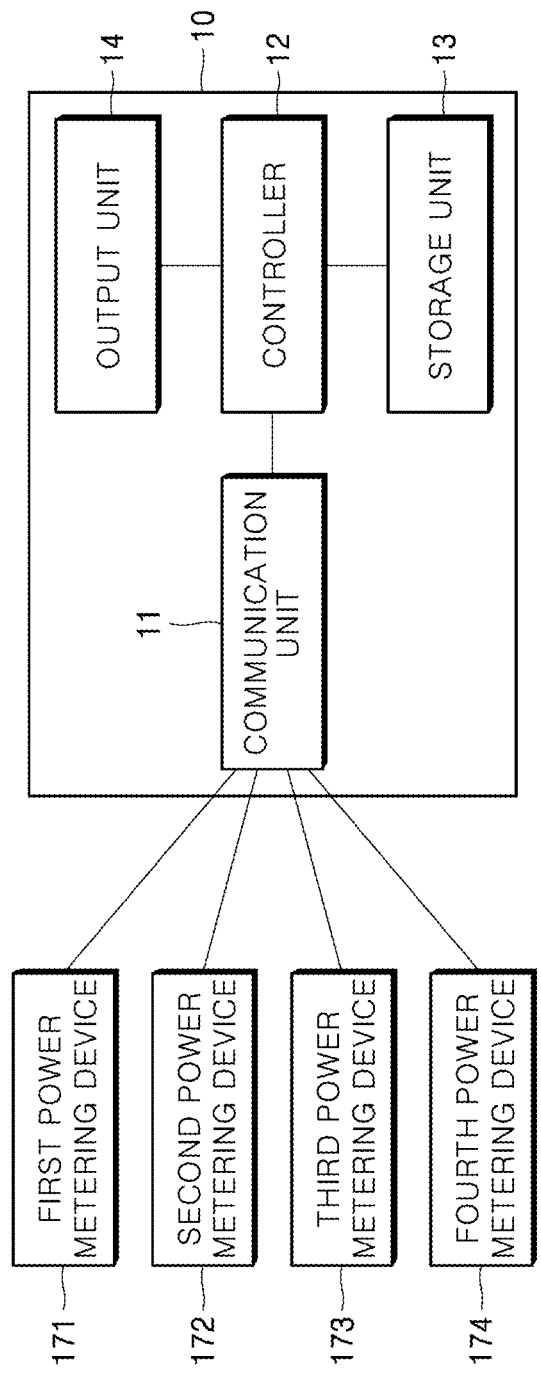
FIG. 20 is a block diagram illustrating a monitoring server according to some embodiments of the present disclosure.

FIG. 20 is a block diagram illustrating a monitoring server according to some embodiments of the present disclosure.

Referring to FIG. 20, the monitoring server 10 according to some embodiments of the present disclosure may include a communication unit 11, a controller 12, a storage unit 13, and an output unit 14.

The communication unit 11 may include one or more modules for enabling wireless or wired communication with the power metering devices 171, 172 and 173 or between external apparatuses.

The communication unit 11 may be configured in the form of a wireless Internet module employing WLAN (Wireless LAN) (Wi-Fi), Wibro (Wireless broadband), WiMAX (World Interoperability for Microwave Access) and HSDPA (High Speed Downlink Packet Access), Bluetooth, or RFID (Radio Frequency Identification). Moreover, the communication unit 11 may be configured in various forms, for example, a short range communication module employing IrDA (Infrared Data Association), UWB (Ultra Wideband) or ZigBee and a wired communication module. The communication unit 11 may receive power data from the power metering devices 171, 172 and 173.

Herein, the power data may include the amount of power input, the amount of power consumption, a power consumption pattern and power consumption patterns of individual loads.

The controller 12 may monitor the power of the system using the power data of the power metering devices 171, 172 and 173 received by the communication unit 11.

Specifically, the controller 12 may acquire at least one of the amount of power input, the amount of power consumption and a power consumption pattern using the power data received from the power metering devices.

The controller 12 may also extract power consumption patterns of the individual loads from the received power data, and acquire the operational statuses and the amount of power consumption of the individual loads using the extracted power consumption patterns of the individual loads.

The controller 12 may analyze the power consumption patterns using the (non-intrusive load monitoring) NILM algorithm. Specifically, when the controller 12 receives power data from the power metering devices, the controller 12 may analyze the received power data using the NILM algorithm, thereby acquiring at least one of the amount of power input, the amount of power consumption, a power consumption pattern, operational statuses of individual loads and the amounts of power consumption of the individual loads. Herein, the NILM algorithm refers to an algorithm capable of measuring the amounts of power consumption of individual loads connected to a specific point supplied with power, using data measured at the specific point.

The controller 12 may store the received power data, a result acquired by analyzing the received power data and information about the corresponding power metering devices in the storage unit 13 or output the same using the output unit 14.

The storage unit 13 may store an algorithm for analysis of power usage patterns executed in the controller 12. Examples of the storage unit 13 include at least one type of storage medium from among flash memory type, hard disk type, multimedia card-micro type, card-type memory (e.g., SD or XD memory), RAM (Random Access Memory), SRAM (Static Random Access Memory), ROM (Read-Only Memory), EEPROM (Electrically Erasable Programmable Read-Only Memory), PROM (Programmable Read-Only Memory), magnetic memory, magnetic disk and optical disk types.

The output unit 14 may output the result of analysis of the power data in various forms, for example, video or audio data on the basis of control by the controller 12. Examples of the output unit 14 may include a display unit and an audio output unit.

Additionally, a user input unit (not shown) may be configured, and it is possible to control the server 10 on the basis of the input through the user input unit. In addition, it is possible to output at least one of the amount of power input, the amount of power consumption, a power consumption pattern, operational statuses of individual loads and the amounts of power consumption of the individual loads.

Referring back to FIG. 2, the power monitoring system according to some embodiments may include the external power supply source 110, the distribution board 120, the first load 130, the ESS 140 and the second load 150. In the following description, it is assumed that the first load 130 and the second load 150 are electronic devices. However, embodiments of the present disclosure are not limited thereto. The loads may represent all devices capable of consuming power supplied thereto.

The power from the external power supply source 110, which is an external power generation source such as a power plant, may be supplied to various loads including the first load 130 in a household through the distribution board 120. The power from the external power supply source 110 may also be applied to the ESS 140 and used to charge the ESS 140. In addition, the power from the external power supply source 110 may be supplied to the electronic device 150, which is connected to the ESS 140, via the ESS 140.

The distribution board 120 may distribute power introduced thereto such that the power is applied to various loads such as the electronic device 130 in a household.

The ESS 140 stores the power from the external power supply source 110. In addition, the ESS 140 may allow the stored power to be applied to the electronic device 150 connected to one end of the ESS 140 at a specific time (or when a user requests power application). For example, power may be stored in the ESS 140 during hours when power consumption is low or the electricity rate is low, for example, during late-night hours. Then, the stored power may be discharged to the electronic device 150 connected to one end of the ESS 140 during hours when demand for electricity surges or the electricity rate is high.

The power metering devices 171, 172, and 173 may be connected to the output of the external power supply source 110, the input of the distribution board 120, and the input of the ESS 140, respectively.

A first power metering device 171 connected to the output of the external power supply source 110 may include at least one module capable of measuring the power supplied from the external power supply source 110.

Further, the first power metering device 171 may include at least one module capable of measuring the total amount of power consumption of the loads and the ESS 140 and an overall power consumption pattern when the power from the external power supply source 110 is supplied to a plurality of loads such as the electronic devices 130 and 150 and the ESS 140.

Further, the first power metering device 171 may measure power consumption patterns of the respective loads and a power consumption pattern of the ESS 140. These power consumption patterns may be analyzed using the NILM algorithm. Thereby, the power consumption patterns may be used to acquire at least one of the amount of power consumed by each of the loads, operational status information about each of the loads, the amount of power consumed by the ESS 140 and operational status information about the ESS 140.

A second power metering device 172 may be connected to the input of the distribution board 120 to detect second power data distributed from the distribution board 120 to the electronic device 130 in a household.

The second power metering device 172 connected to the input of the distribution board 120 may include at least one module capable of measuring the total amount of power consumption of a plurality of loads such as the electronic device 130 in a household when the power from the external power supply source 110 is supplied to the loads.

The second power metering device 172 may also measure power consumption patterns of the respective loads. Thereafter, the power consumption patterns of the loads may be analyzed using the NILM algorithm. Thereby, the power consumption patterns may be used to acquire at least one of the amount of power consumed by each of the loads, operational status information about each of the loads, and power consumption pattern information about each of the loads.

A third power metering device 173 connected to the input of the ESS 140 may include at least one module capable of measuring the amount of power stored in the ESS 140 or the amount of power discharged from the ESS 140.

The third power metering device 173 may also include at least one module capable of measuring a power consumption pattern of the ESS 140. The power consumption pattern of the ESS 140 may be analyzed using the NILM algorithm. Thereby, the power consumption pattern of the ESS 140 may be used to acquire at least one of the amount of power stored in or discharged from the ESS 140 and operational status information about the ESS 140.

In addition, the third power metering device 173 may measure a power consumption pattern of the electronic device 150 connected to the ESS 140. Thereafter, the power consumption pattern of the electronic device 150 may be analyzed using the NILM algorithm. Thereby, the power consumption pattern of the electronic device 150 may be used to acquire at least one of the amount of power consumption in the electronic device 150 and operational status information about the electronic device 150.

Hereinafter, a detailed description will be given of a method for monitoring power consumed by loads based on the configuration of the power monitoring system including the power metering devices described above according to some embodiments of the present disclosure, with reference to FIGS. 3 to 10. Although the method for monitoring power described below is limited to a sequence of collecting data, it should be noted that the data may be collected from the respective power metering devices, irrespective of the sequence of collection of data.

FIGS. 3 to 10 are flowcharts illustrating methods for monitoring power in a power monitoring system according to some embodiments of the present disclosure.

Figure 3:
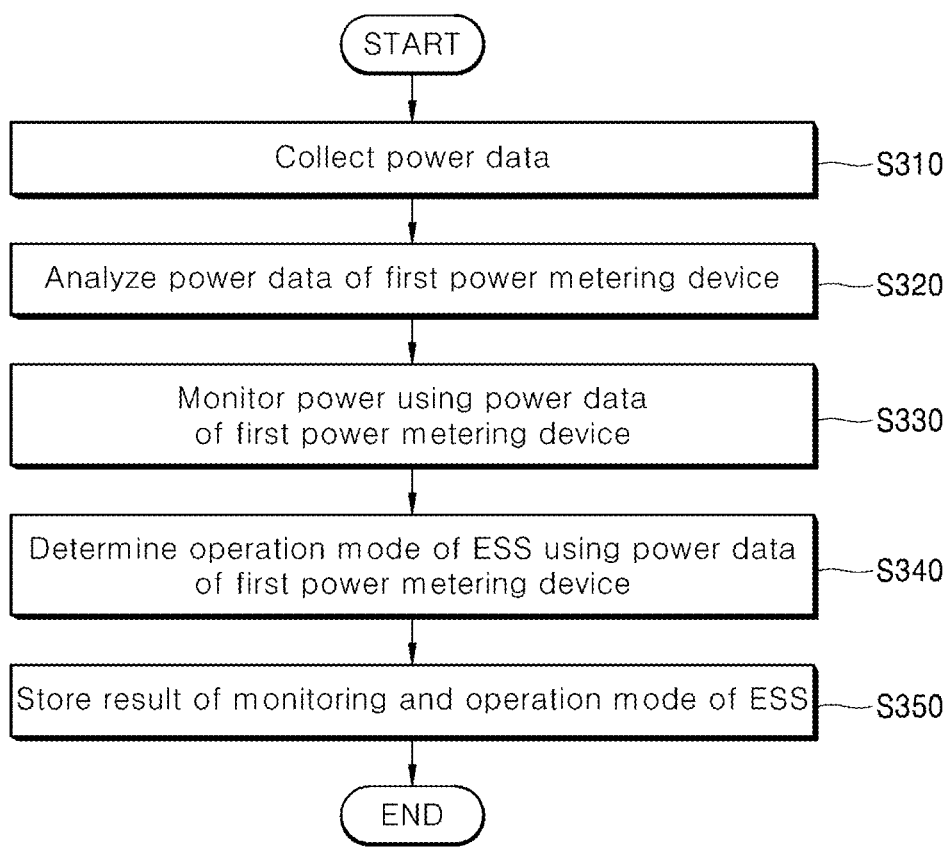
FIGS. 3 and 4 are flowcharts illustrating a method for monitoring power when an energy storage system operates in an AC PASS mode, according to some embodiments of the present disclosure.

FIG. 3 is a flowchart illustrating a method for monitoring power in the monitoring server 10 using first power data detected by the first power metering device when the ESS operates in an AC PASS mode (for example, AC Pass Through mode in which the AC current is passed through).

Referring to FIG. 3, the monitoring server 10 may collect power data via the communication unit 11 (S310). Specifically, the monitoring server 10 may receive first power data from the first power metering device 171 provided to the output of the external power supply source 110.

In FIG. 2, the second power metering device 172 is illustrated as being provided to the input of the distribution board 120 and the third power metering device 173 is provided to the input of the ESS 140. Since the second power data of the second power metering device 172 and the third power data of the third power metering device 173 can be estimated based on the first power data, power may be monitored without using the second and third power data in some embodiments.

The controller 12 of the monitoring server 10 may analyze the first power data of the first power metering device 171 collected via the communication unit 11 (S320).

In this case, the first power data may include information about the amount of power applied from the external power supply source 110.

The first power data may also include the total amount of power consumption of the plurality of electronic devices 130, the ESS 140 and the electronic device 150 connected to the ESS 140 and a total power consumption pattern.

Further, the first power data may include power consumption patterns of the individual electronic devices constituting the plurality of electronic devices 130 or the power consumption pattern of the electronic device 150 connected to the ESS 140.

The controller 12 of the monitoring server 10 may monitor the power of the system based on the first power data detected by the first power metering device 171 (S330).

Specifically, the controller 12 may acquire the amount of power applied from the external power supply source 110 using the first power data detected by the first power metering device 171. The controller 12 may also acquire at least one of the amount of power consumption of each individual electronic device constituting the plurality of electronic device 130 and the operational status information about the individual electronic devices, using the first power data detected by the first power metering device 171. The controller 12 may also acquire at least one of the amount of power consumption of the electronic device 150 connected to the ESS 140 and operational status information about the electronic device 150, using the first power data detected by the first power metering device 171. In this case, the NILM algorithm may be used.

The controller 12 of the monitoring server 10 may determine the operational status of the ESS 140 using the first power data detected by the first power metering device 171 (S340). Specifically, when the ESS 140 is in the AC PASS mode, the ESS 140 is not charged with any power. Nor does the ESS 140 discharge power. Thereby, the controller 12 may determine that the operational status of the ESS 140 is the AS PASS mode.

While it is illustrated in some embodiments that an operational mode of the ESS is determined after the power in the system is monitored, embodiments of the present disclosure are not limited thereto. Specifically, if power is neither stored in nor discharged from the ESS 140, the controller 12 may determine that the operational status of the ESS 140 is the AC PASS mode, using the first power data. Thereafter, the controller 12 may monitor power in the system according to the algorithm of FIG. 3.

The controller 12 may store, in the storage unit 13, the first power data, the result of monitoring acquired using the first power data and the operational status information about the ESS 140 (S350).

Figure 4:
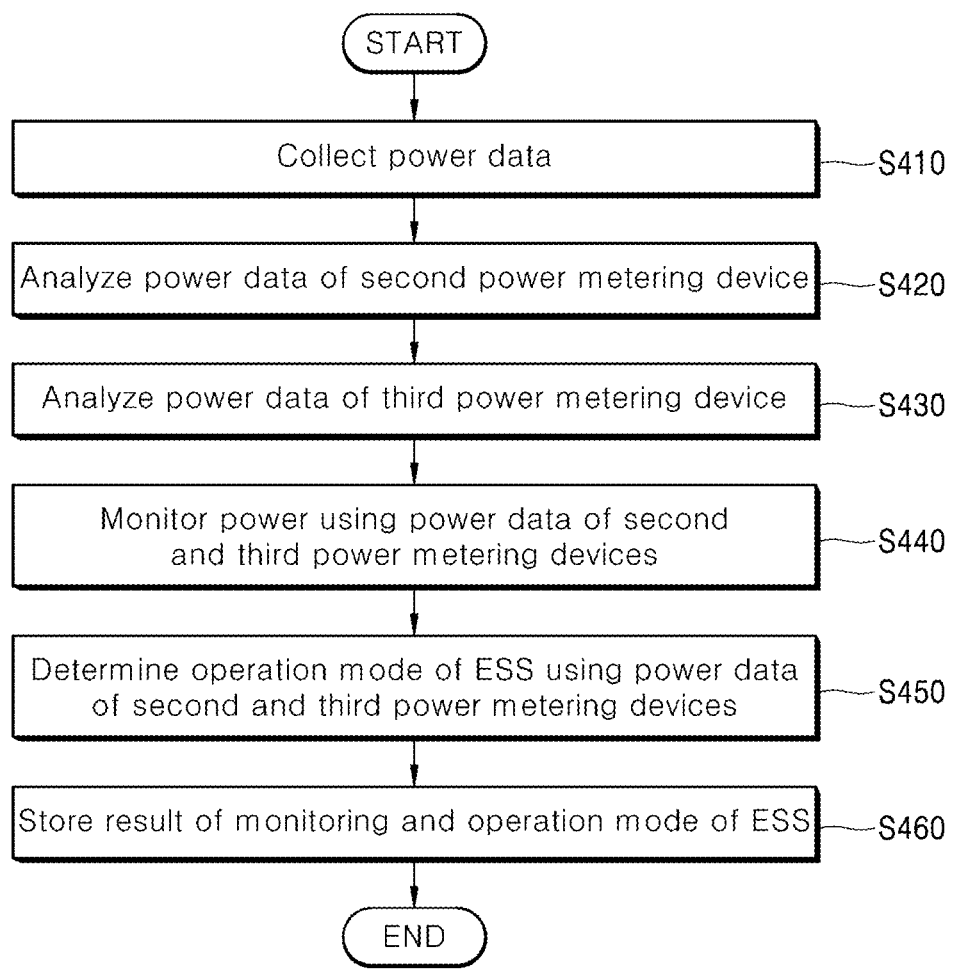

FIG. 4 is a flowchart illustrating a method for monitoring power in the monitoring server 10 using second power data detected by the second power metering device and third power data detected by the third power metering device when the ESS 140 operates in the AC PASS mode.

Referring to FIG. 4, the monitoring server 10 may collect power data via the communication unit 11 (S410). Specifically, the monitoring server 10 may receive second power data from the second power metering device 172 provided to the input of the distribution board 120. In addition, the monitoring server 10 may receive third power data from the third power metering device 173 provided to the input of the ESS 140.

In FIG. 2, the first power metering device 171 is illustrated as being provided to the output of the external power supply source 110. Since the first power data of the first power metering device 171 can be estimated based on the second power data and third power data, power may be monitored without using the first power data in some embodiments.

The controller 12 of the monitoring server 10 may analyze the second power data of the second power metering device 172 collected via the communication unit 11 (S420).

In this case, the second power data may include the amount of power applied to the distribution board 120.

In addition, the second power data may include the total amount of power consumption of the plurality of electronic devices 130, the total power consumption pattern of the plurality of electronic devices 130, and the amount of power consumption of each individual electronic device constituting the plurality of electronic device 130.

The controller 12 of the monitoring server 10 may analyze the third power data of the third power metering device 173 collected via the communication unit 11 (S430).

In this case, the third power data may include the amount of power consumption of at least one of the ESS 140 and the electronic device 150.

The third power data may further include at least one of the power consumption pattern of the ESS 140 and the power consumption pattern of the electronic device 150 connected to the ESS.

The controller 12 of the monitoring server 10 may monitor the power of the whole system using the second power data detected by the second power metering device 172 and the third power data detected by the third power metering device 173 (S440).

Specifically, the controller 12 may acquire at least one of the total amount of power consumption of the plurality of electronic devices 130, the amount of power consumption of each individual electronic device, and operational status information about the individual electronic devices, using the second power data detected by the second power metering device 172. In addition, the controller 12 may acquire the amount of power consumption of the electronic device 150 connected to the ESS and operational status information about the electronic device 150, using the third power data detected by the third power metering device 173. In this case, the NILM algorithm may be used.

The controller 12 may also acquire the amount of power applied from the external power supply source 110, using the second power data detected by the second power metering device 172 and third power data detected by the third power metering device 173. Specifically, the controller 12 may acquire the amount of power applied from the external power source 110 by adding the total amount of power consumption of the plurality of electronic devices 130 included in the second power data to the amount of power consumption of the electronic device 150 included in the third power data.

The controller 12 of the monitoring server 10 may determine the operational status of the ESS 140 using the third power data detected by the third power metering device 173 (S450). Specifically, when the ESS 140 is in the AC PASS mode, the ESS 140 neither stores power nor discharges power, and accordingly the controller 12 may detect this state and determine that the operational status of the ESS 140 is the AS PASS mode.

While it is illustrated in some embodiments that an operational mode of the ESS is determined after the power in the system is monitored, embodiments of the present disclosure are not limited thereto. Specifically, as ESS 140 neither stores power nor discharges power, the controller 12 may determine that the operational status of the ESS 140 is the AC PASS mode, using the third power data. Thereafter, the controller 12 may monitor the power in the system according to the algorithm of the FIG. 4.

The controller 12 may store, in the storage unit 13, at least one of the result of monitoring acquired using the second power data and the third power data and the operational status information about the ESS 140 (S460)

Hereinafter, a method for monitoring power in a monitoring server when the ESS 140 operates in a charge mode will be described with reference to FIGS. 5 and 6.

Figure 5:
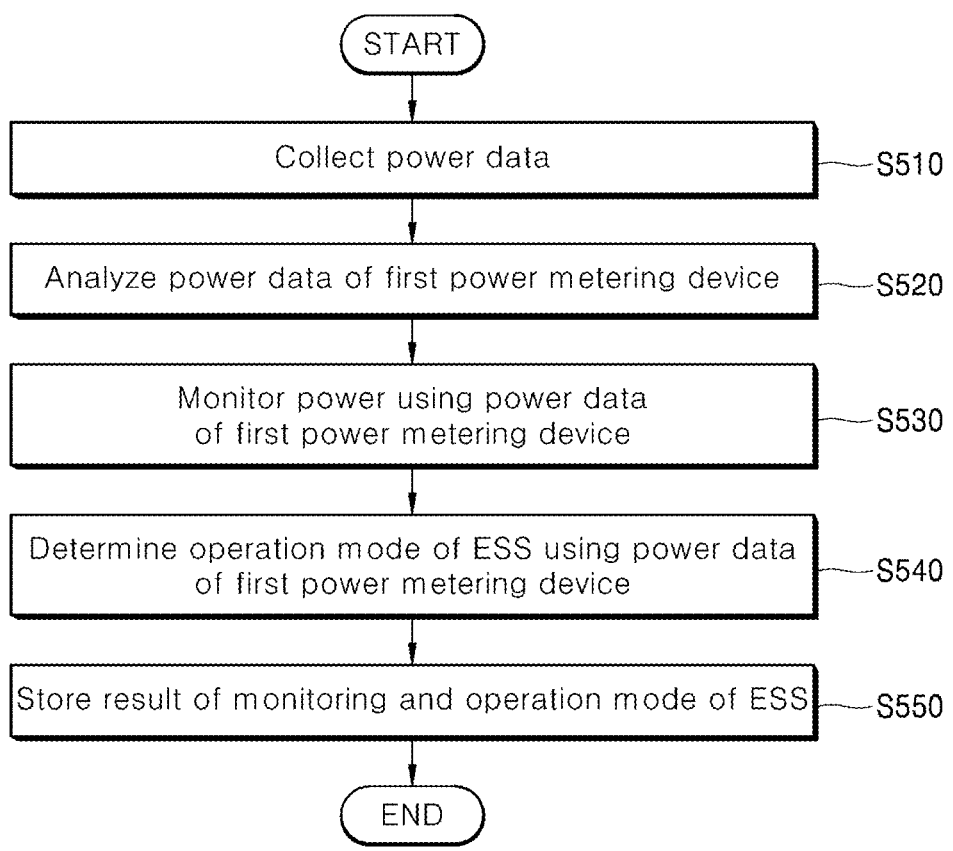
FIGS. 5 and 6 are flowcharts illustrating a method for monitoring power when an energy storage system operates in a charge mode, according to some embodiments of the present disclosure.

FIG. 5 is a flowchart illustrating a method for monitoring power in the monitoring server 10 using first power data detected by the first power metering device when an energy storage system operates in a charge mode.

Referring to FIG. 5, the monitoring server 10 may collect power data via the communication unit 11 (S510). Specifically, the monitoring server 10 may receive first power data from the first power metering device 171 provided to the output of the external power supply source 110.

In FIG. 2, the second power metering device 172 is illustrated as being provided to the input of the distribution board 120, and the third power metering device 173 is illustrated as being provided to the input of the ESS 140. Since the second data of the second power metering device 172 and the third power data of the third power metering device 173 can be estimated based on the first power data, power may be monitored without using the second and third power data in some embodiments.

The controller 12 of the monitoring server 10 may analyze the first power data of the first power metering device 171 collected via the communication unit 11 (S520).

In this case, the first power data may include information about the amount of power applied from the external power supply source 110. The first power data may further include the total amount of power consumption of the plurality of electronic devices 130, the ESS 140 and the electronic device 150 connected to the ESS 140 and a total power consumption pattern thereof.

The first power data may further include power consumption patterns of the individual electronic devices constituting the plurality of electronic devices 130 or the power consumption pattern of the ESS 140. The first power data may further include the power consumption pattern of the electronic device 150 connected to the ESS 140. In some embodiments, the ESS 140 operates in the charge mode, and thus the amount of power consumption of the electronic device 150 is 0.

The controller 12 of the monitoring server 10 may monitor power of the system based on the first power data detected by the first power metering device 171 (S530).

Specifically, the controller 12 may acquire the amount of power applied from the external power supply source 110 using the first power data detected by the first power metering device 171. The controller 12 may also acquire at least one of the total amount of power consumption of the plurality of electronic devices 130, the amount of power consumed by each individual electronic device constituting the plurality of electronic devices 130 and operational status information about the individual electronic devices, using the first power data detected by the first power metering device 171. 또한, the controller 12는, using the first power data detected by the first power metering device 171, may acquire at least one of the amount of power consumed by the ESS 140 and operational status information. In this case, the NILM algorithm may be used.

The controller 12 of the monitoring server 10 may determine the operational status of the ESS 140 using the first power data detected by the first power metering device 171 (S540).

Specifically, the first power data may include the power consumption pattern of the ESS 140. Accordingly, the controller 12 may determine that the ESS 140 operates in the charge mode, by analyzing the power consumption pattern of the ESS 140.

While it is illustrated in some embodiments that an operational mode of the ESS is determined after the power in the system is monitored, embodiments of the present disclosure are not limited thereto. Specifically, the controller 12 may determine that the operational status of the ESS 140 is the charge mode, by analyzing the power consumption pattern of the ESS 140 using the first power data. Thereafter, the controller 12 may monitor the power in the system according to the algorithm of FIG. 5.

The controller 12 may store, in the storage unit 13, the first power data, the result of monitoring acquired using the first power data, and the operational status information about the ESS 140 (S550).

Figure 6:
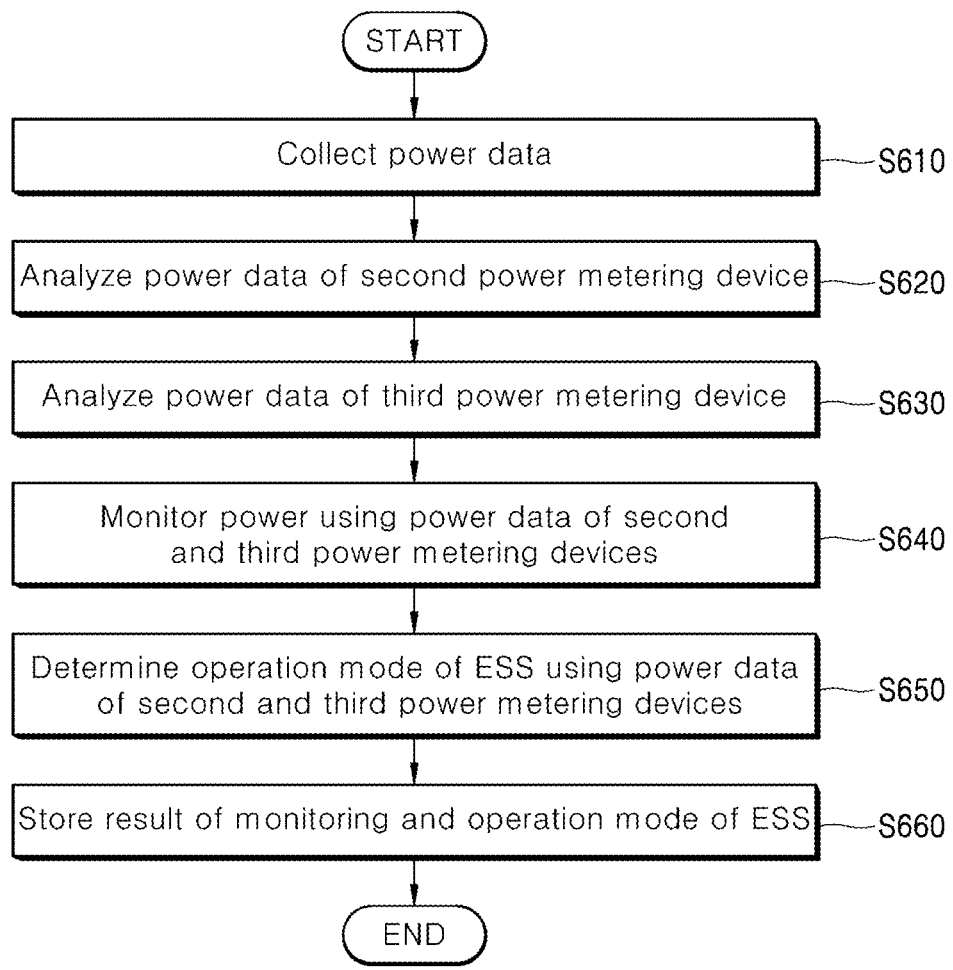

FIG. 6 is a flowchart illustrating a method for monitoring power in the monitoring server 10 using second power data detected by the second power metering device and third power data detected by the third power metering device when the ESS 140 is in a charge mode.

Referring to FIG. 6, the monitoring server 10 may collect power data via the communication unit 11 (S610). Specifically, the monitoring server 10 may receive second power data from the second power metering device 172 provided to the input of the distribution board 120. In addition, the monitoring server 10 may receive third power data from the third power metering device 173 provided to the input of the ESS 140.

In FIG. 2, the first power metering device 171 is illustrated as being provided to the output of the external power supply source 110. However, since the first power data of the first power metering device 171 can be estimated based on the second power data and the third power data, power may be monitored without using the first power data in some embodiments.

The controller 12 of the monitoring server 10 may analyze the second power data of the second power metering device 172 collected via the communication unit 11 (S620).

In this case, the second power data may include information about the amount of power applied to the distribution board 120.

The second power data may also include the total amount of power consumption of the plurality of electronic devices 130 and a total power consumption pattern of plurality of electronic devices 130. Further, the second power data may include power consumption patterns of the individual electronic devices constituting the plurality of electronic devices 130.

The controller 12 of the monitoring server 10 may analyze the third power data of the third power metering device 173 collected via the communication unit 11 (S630).

In this case, the third power data may include at least one of the amount of power consumption of the ESS 140 and the power consumption pattern of the ESS 140.

The controller 12 of the monitoring server 10 may monitor the power of the whole system using the second power data detected by the second power metering device 172 and the third power data detected by the third power metering device 173 (S640)

Specifically, the controller 12 may acquire at least one of the total amount of power consumption of the plurality of electronic devices 130, the amount of power consumption of each individual electronic device, and operational status information about the individual electronic devices, using the second power data detected by the second power metering device 172. The controller 12 may also acquire the amount of power consumed by the ESS 140 and the operational status information using the third power data detected by the third power metering device 173. In this case, the NILM algorithm may be used.

The controller 12 may also acquire the amount of power applied from the external power supply source 110 using the second power data detected by the second power metering device 172 and the third power data detected by the third power metering device 173. Specifically, the controller 12 may acquire the amount of power applied from the external power source 110 by adding the total amount of power consumption of the plurality of electronic devices 150 included in the second power data to the amount of power consumption of the ESS 140 included in the third power data.

The controller 12 of the monitoring server 10 may determine the operational status of the ESS 140 using the third power data detected by the third power metering device 173 (S650).

Specifically, the controller 12 may determine that the operational status of the ESS 140 is the charge mode, by analyzing a power pattern of the ESS 140 included in the third power.

The controller 12 may store, in the storage unit 13, the second and third power data, the result of monitoring acquired using the second and third power data, and the operational status information about the ESS 140 (S660).

Figure 7:
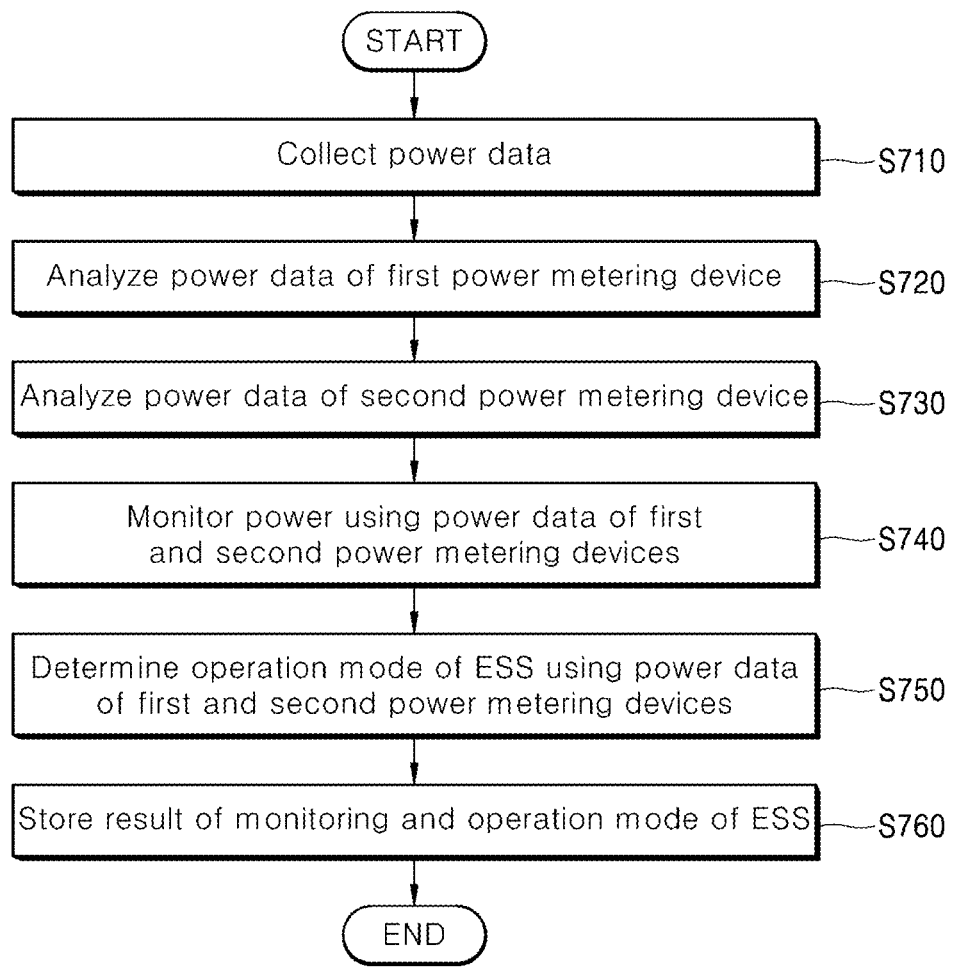
FIGS. 7 and 8 are flowcharts illustrating a method for monitoring power when an energy storage system operates in a discharge mode, according to some embodiments of the present disclosure.

FIG. 7 is a flowchart illustrating a method for monitoring power in the monitoring server 10 using first power data detected by the first power metering device and second power data detected by the second power metering device when the ESS 140 operates in a discharge mode (as a power generation source).

Referring to FIG. 7, the monitoring server 10 may collect power data from the first power metering device 171 and the second power metering device 172 via the communication unit 11 (S710).

In FIG. 2, the third power metering device 173 is illustrated as being provided to the input of the ESS 140. However, since the third power data of the third power metering device 173 can be estimated based on the first power data and the second power data, power may be monitored without using the third power data in some embodiments.

The controller 12 of the monitoring server 10 may analyze the first power data of the first power metering device 171 collected via the communication unit 11 (S720).

In this case, the first power data may include information about the amount of power applied from the external power supply source 110.

The controller 12 of the monitoring server 10 may analyze the second power data of the second power metering device 172 collected via the communication unit 11 (S730).

In this case, the second power data may include the amount of power applied to the distribution board 120. Further, the second power data may include the total amount of power consumption of the plurality of electronic devices 130, a total power consumption pattern of the plurality of electronic devices 130 and power consumption patterns of the individual electronic devices constituting the plurality of electronic devices 130.

The controller 12 of the monitoring server 10 may monitor the power of the whole system using the first power data detected by the first power metering device 171 and the second power data detected by the second power metering device 172 (S740).

Specifically, the controller 12 may acquire the amount of power applied from the external power supply source 110 using the first power data detected by the first power metering device 171. The controller 12 may also acquire at least one of the total amount of power consumption of the plurality of electronic devices 130, the amount of power consumption of each individual electronic device, and operational status information about the individual electronic devices, using the second power data detected by the second power metering device 172. In this case, the NILM algorithm may be used.

In addition, the controller 12 may acquire the amount of discharge of the ESS 140 using the first power data and second power data. Specifically, the controller 12 may acquire the amount of discharge of the ESS 140 by subtracting the supplied power of the external power supply source 110 included in the first power data from the total amount of power consumption of the plurality of electronic devices 130 included in the second power data.

The controller 12 of the monitoring server 10 may determine the operational status of the ESS 140 using the first power data detected by the first power metering device 171 and the second power data detected by the second power metering device 172 (S750). Specifically, if the total amount of power consumption of the plurality of electronic devices 130 included in the second power data is larger than the amount of supplied power of the external power supply source 110 included in the first power data, the controller 12 may determine that the ESS 140 is in the discharge mode, namely the ESS 140 operates as a power generation source.

While it is illustrated in some embodiments that an operational mode of the ESS is determined after the power in the system is monitored, embodiments of the present disclosure are not limited thereto. Specifically, the controller 12 may determine that the operational status of the ESS 140 is the discharge mode, using the first power data and second power data. Thereafter the controller 12 may monitor the power in the system according to the algorithm of FIG. 7.

The controller 12 may store, in the storage unit 13, at least one of the first and second power data and the result of monitoring acquired using the first and second power data and the operational status information about the ESS 140 (S750).

Figure 8:
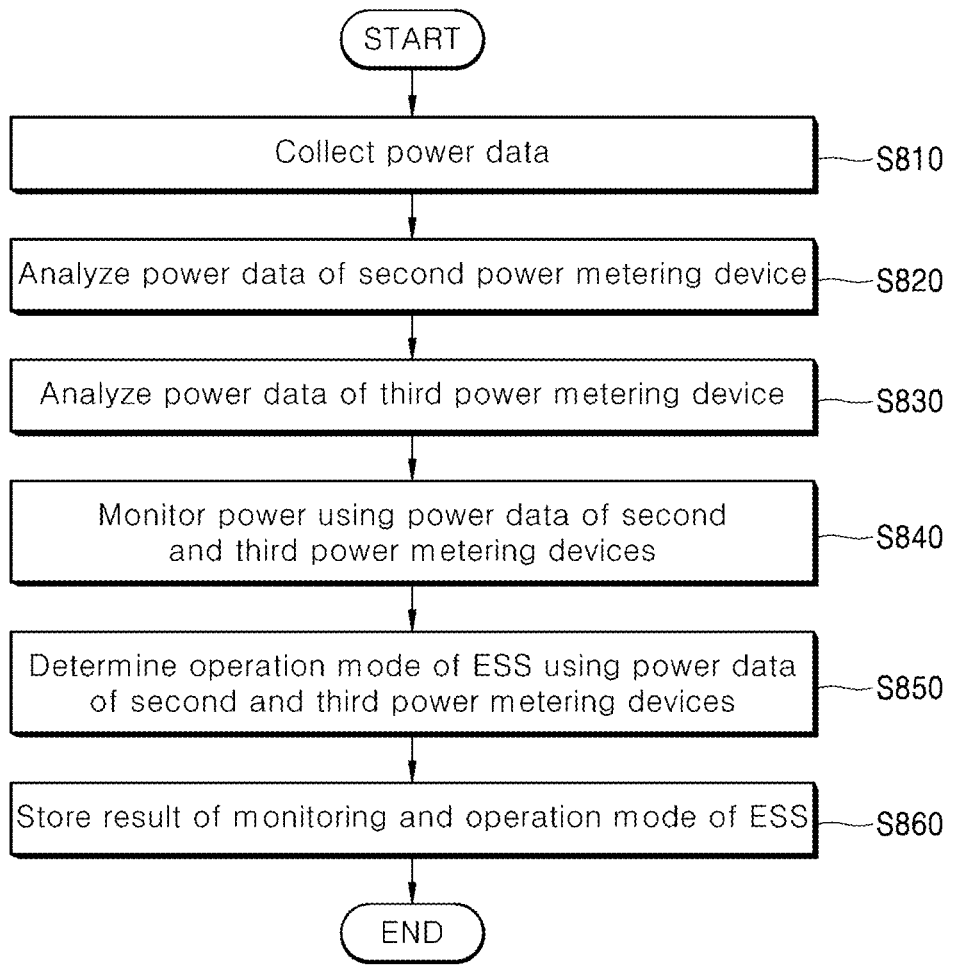

FIG. 8 is a flowchart illustrating a method for monitoring power in the monitoring server 10 using second power data detected by the second power metering device and third power data detected by the third power metering device when the ESS 140 is in the discharge mode.

Referring to FIG. 8, the monitoring server 10 may collect power data from the second power metering 172 and the third power metering device 173 via the communication unit 11 (S810).

In FIG. 2, the first power metering device 171 is illustrated as being provided to the output of the external power supply source 110. Since the first power data of the first power metering device 171 can be estimated based on the second power data and third power data, power may be monitored without using the first power data in some embodiments.

The controller 12 of the monitoring server 10 may analyze the second power data of the second power metering device 172 collected via the communication unit 11 (S820).

In this case, the second power data may include information about the amount of power applied to the distribution board 120.

The second power data may also include the total amount of power consumption of the plurality of electronic devices 130, the total power consumption pattern of the plurality of electronic devices 130 and power consumption patterns of the individual electronic devices constituting the plurality of electronic devices 130.

The controller 12 of the monitoring server 10 may analyze the third power data of the third power metering device 173 collected via the communication unit 11 (S830).

In this case, the third power data may include information about the amount of power discharged from the ESS 140.

The controller 12 of the monitoring server 10 may monitor the power of the whole system using the second power data detected by the second power metering device 172 and the third power data detected by the third power metering device 173 (S840).

Specifically, the controller 12 may acquire at least one of the total amount of power consumption of the plurality of electronic devices 130, the amount of power consumption of each individual electronic device constituting the plurality of electronic devices 130 and operational status information about the individual electronic devices, using the second power data detected by the second power metering device 172. The controller 12 may acquire the amount of discharge of the ESS 140 using the third power data detected by the third power metering device 173. In this case, the NILM algorithm may be used.

The controller 12 of the monitoring server 10 may determine the operational status of the ESS 140 using the third power data (S850). Specifically, if the power applied to the ESS 140 as included in the third power data is negative, the controller 12 may determine that the ESS 140 is in the discharge mode, namely the ESS 140 operates as a power generation source.

While it is illustrated in some embodiments that an operational mode of the ESS is determined after the power in the system is monitored, embodiments of the present disclosure are not limited thereto. Specifically, the controller 12 may determine that the operational status of the ESS 140 is the discharge mode, using the third power data. Thereafter, the controller 12 may monitor the power in the system according to the algorithm of FIG. 8.

The controller 12 may store, in the storage unit 13, at least one of the second and third power data, the result of monitoring acquired using the second and third power data and the operational status information about the ESS 140 (S860).

Figure 9:
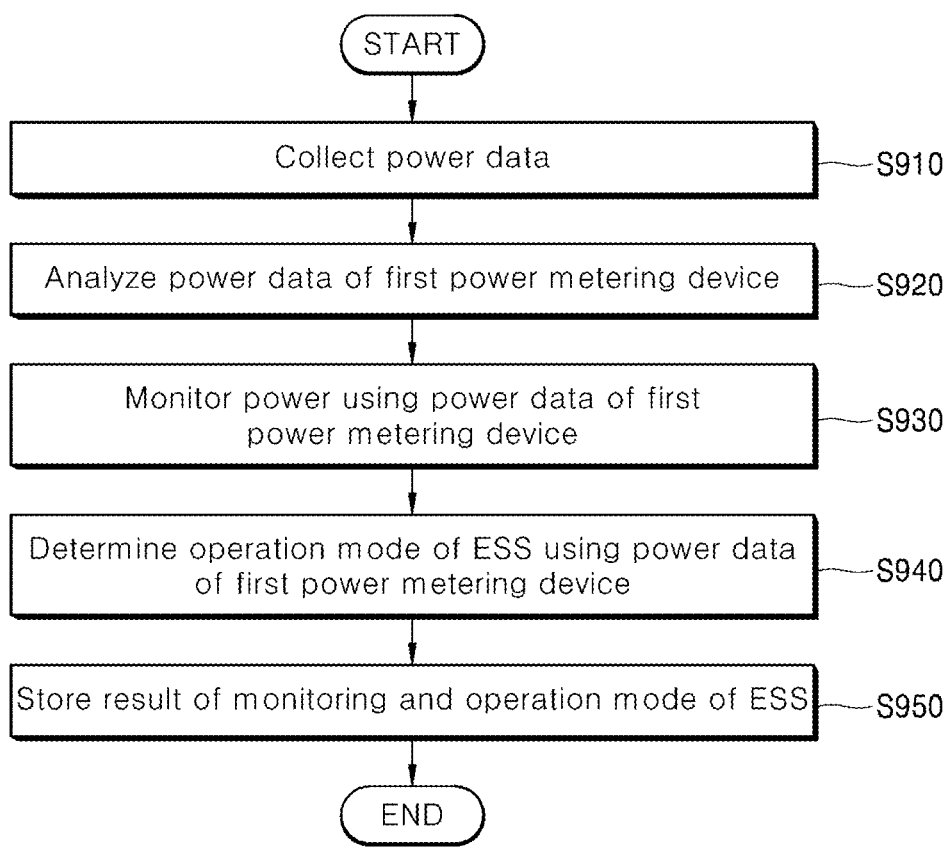
FIGS. 9 and 10 are flowcharts illustrating a method for monitoring power when an energy storage system operates in a charge mode and an AC PASS mode, according to some embodiments of the present disclosure.

FIG. 9 is a flowchart illustrating a method for monitoring power in the monitoring server 10 using the first power data detected by the first power metering device when the ESS 140 operates in the charge and AC PASS modes.

Referring to FIG. 9, the monitoring server 10 may collect the first power data from the first power metering device via the communication unit 11 (S910).

In FIG. 2, the second power metering device 172 is illustrated as being provided to the input of the distribution board 120 and the third power metering device 173 is provided to the input of the ESS 140. However, since the second power data of the second power metering device 172 and the third power data of the third power metering device 173 can be estimated based on the first power data, power may be monitored without using the second and third power data in some embodiments.

The controller 12 of the monitoring server 10 may analyze the first power data of the first power metering device 171 collected via the communication unit 11 (S920).

In this case, the first power data may include information about the amount of power supplied from the external power supply source 110.

The first power data may also include the total amount of power consumption of the plurality of electronic devices 130, the ESS 140 and the electronic device 150 connected to the ESS 140 and a total power consumption pattern.

The first power data may also include power consumption patterns of the individual electronic devices constituting the plurality of electronic devices 130, the ESS 140 and the electronic device 150 connected to the ESS 140.

The controller 12 of the monitoring server 10 may monitor the power of the whole system using the first power data detected by the first power metering device 171 (S930).

Specifically, the controller 12 may acquire information about the amount of power supplied from the external power supply source 110 using the first power data detected by the first power metering device 171. The controller 12 may also acquire information about the amount of power consumed by each individual electronic device constituting the plurality of electronic devices 130 or the operational statuses of the individual electronic devices using the first power data. The controller 12 may also acquire information about the amount of power consumed by (namely, stored in) the ESS 140, using the first power data. The controller 12 may also acquire information about the amount of power consumed by the electronic device 150 connected to the ESS 140, using the first power data. In this case, the NILM algorithm may be used.

The controller 12 of the monitoring server 10 may determine the operational status of the ESS 140, using the first power data (S940). Specifically, the controller 12 may determine whether the ESS 140 operates in the charge mode by analyzing the power usage pattern of the ESS 140 included in the first power data, and determine whether the electronic device 150 consumes power by analyzing the power usage pattern of the electronic device 150, which is connected to the ESS, included in the first power data. Thereby, the controller 12 may determine whether the ESS 140 operates in the charge and AC PASS modes.

While it is illustrated in some embodiments that an operational mode of the ESS is determined after the power in the system is monitored, embodiments of the present disclosure are not limited thereto. Specifically, after the controller 12 determines that the operational status of the ESS 140 is the charge and AC PASS modes, using the first power data, the controller 12 may monitor the power in the system according to the algorithm of FIG. 9.

Figure 10:
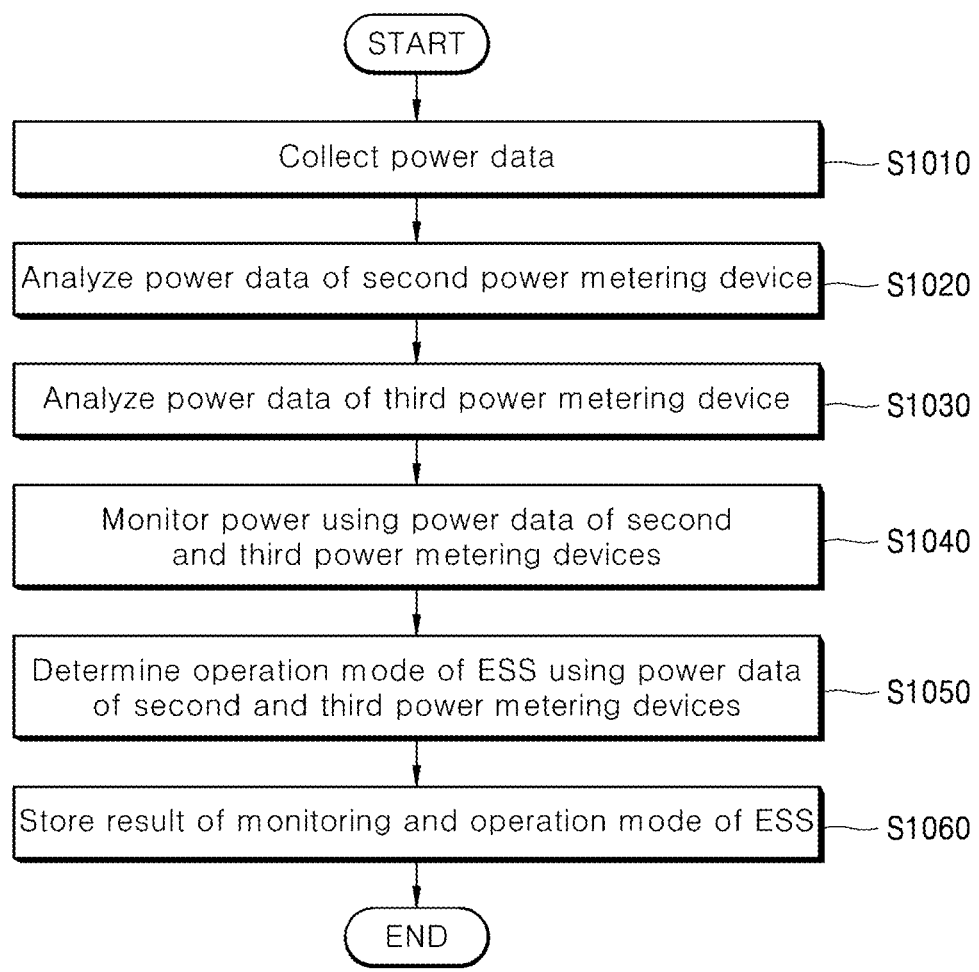

FIG. 10 is a flowchart illustrating a method for monitoring power in the monitoring server 10 using the second power data detected by the second power metering device and the third power data detected by the third power metering device when the ESS 140 operates in the charge and AC PASS modes.

Referring to FIG. 10, the monitoring server 10 may collect second power data from the second power metering device 172 and third power data from the third power metering device 173 via the communication unit 11 (S1010).

In FIG. 2, the first power metering device 171 is illustrated as being provided to the output of the external power supply source 110. However, since the first power data of the first power metering device 171 can be estimated based on the second power data of the second power metering device 172 and the third power data of the third power metering device 173, power may be monitored without using the first power data in some embodiments.

The controller 12 of the monitoring server 10 may analyze the second power data of the second power metering device 172 collected via the communication unit 11 (S1020).

In this case, the second power data may include the amount of power applied to the distribution board 120.

Further, the second power data may include the total amount of power consumption of the plurality of electronic devices 130, the total power consumption pattern of the plurality of electronic devices 130 and power consumption patterns of the individual electronic devices constituting the plurality of electronic devices 130.

The controller 12 of the monitoring server 10 may analyze the third power data of the third power metering device 173 collected via the communication unit 11 (S1030).

In this case, the third power data may include the total amount of power consumption of the ESS 140 and the electronic device 150 connected to the ESS 140.

The third power data may also include information about the power consumption pattern of the ESS 140 or the power consumption pattern of the electronic device 150 connected to the ESS 140.

The controller 12 of the monitoring server 10 may monitor the power of the whole system using the second power data detected by the second power metering device 172 and the third power data detected by the third power metering device 173 (S1040).

Specifically, the controller 12 may acquire at least one of the total amount of power consumption of the plurality of electronic devices 130, the amount of power consumption of each individual electronic device, and operational status information about the individual electronic devices, using the second power data. The controller 12 may also acquire information about the amount of power consumption of the ESS 140 (namely, the amount of charge of the ESS 140) and the amount of power consumption of the electronic device 150 connected to the ESS 140 using the third power data. In this case, the NILM algorithm may be used.

The controller 12 may also acquire information about the amount of power supplied from the external power supply source 110, using the second power data and third power data. Specifically, the controller 12 may acquire information about the amount of power supplied from the external power supply source 110 by adding the total amount of power consumption of the plurality of electronic devices 130 acquired using the second power data to the amount of power consumption of the ESS 140 and the electronic device 150 acquired using the third power data.

The controller 12 of the monitoring server 10 may determine the operational status of the ESS 140 using the third power data detected by the third power metering device 173 (S1050). Specifically, the controller 12 may analyze the power consumption pattern of the ESS 140 included in the third power data. If the ESS 140 and the electronic device 150 connected to the ESS are consuming power, the controller 12 may determine that the ESS 140 operates in the charge and AC PASS modes.

While it is illustrated in some embodiments that an operational mode of the ESS is determined after the power in the system is monitored, embodiments of the present disclosure are not limited thereto. Specifically, the controller 12 may determine that the operational status of the ESS 140 is the charge and AC PASS modes, using the third power data. Thereafter, the controller 12 may monitor the power in the system according to the algorithm of FIG. 10.

The controller 12 may store, in the storage unit 13, at least one of the second and third power data, the result of monitoring acquired using the second and third power data and the operational status information about the ESS 140 (S1060).

In this way, the amount of power supplied from the external power supply source 110, the amounts of charge and discharge of the ESS 140, the total amount of power consumption of the plurality of electronic devices 130, the amounts of power consumed by the individual electronic devices, and operational status information about the individual electronic devices may all be obtained using the first power metering device 171, the second power metering device 172 and the third power metering device 173. According, it is possible to comprehensively monitor power production and consumption.

Further, with the present disclosure, it is possible to estimate the amount of power supplied from the external power supply source 110 and the amount of power used by the ESS 140 even if one or more of the first power metering device 171, the second power metering device 172 and the third power metering device 173 are not provided. Accordingly, it is possible to comprehensively monitor power production and consumption irrespective of malfunction or maintenance of any of the plurality of power metering devices.

Further, as the first power metering device 171, the second power metering device 172, and the third power metering device 173 are all used, the power in the system may be monitored with a minimized error.

Figure 11:
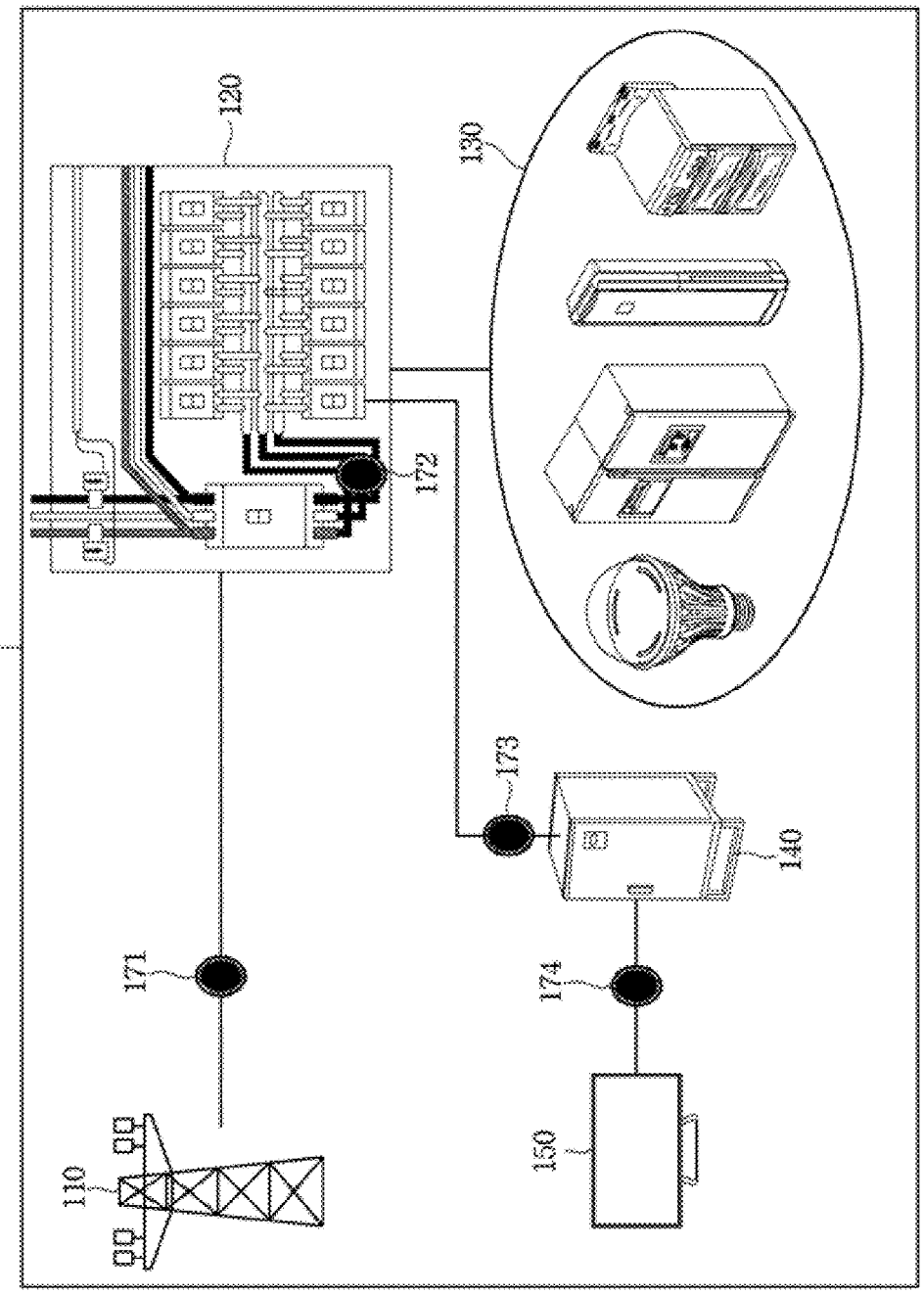
FIG. 11 is a block diagram illustrating a system for monitoring power consumed by loads according to some embodiments of the present disclosure.

FIG. 11 is a block diagram illustrating a system for monitoring power consumed by loads according to some embodiments of the present disclosure.

Referring to FIG. 11, the system for monitoring power consumed by loads according to some embodiments of the present disclosure includes a monitoring server 10, an external power supply source 110, a distribution board 120, electronic devices 130 and an ESS 140. In particular, the outputs or inputs of the external power supply source 110, the distribution board 120, the ESS 140 and the electronic device 150 connected to the ESS 140 may include power metering devices 171, 172, 173 and 174 respectively to detect power data input to or output from the aforementioned components.

The monitoring server 10 may obtain power data including the amounts of power consumption, applied power or power consumption patterns of loads and power sources measured by the power metering devices 171, 172, 173 and 174. In addition, the monitoring server 10 may monitor and output, based on the obtained data, the power supplied to the whole system, power consumption of the whole system, and power consumption and operational statuses of individual loads in the system.

The power from the external power supply source 110, which is an external power generation source such as a power plant, may be supplied to various loads including the electronic devices 130 in a household through the distribution board 120. The power from the external power supply source 110 may also be applied to the ESS 140 via the distribution board 120 and used to charge the ESS 140. In addition, the power from the external power supply source 110 may be applied to the electronic device 150 connected to the ESS 140 via the distribution board 120 and the ESS 140.

The distribution board 120 may distribute power applied thereto to various loads including the electronic devices 130 in a household, the ESS 140, and the electronic device 150 connected to the ESS 140.

The ESS 140 may be connected to the output of the distribution board 120 to store the power from the external power supply source 110 and allow the stored power to be applied to the electronic device 150, connected to the ESS 140, via the distribution board 120 at a specific time (or when a user requests power application). For example, power may be stored in the ESS 140 during hours when power consumption is low or the electricity rate is low, for example, during late-night hours. Then, the stored power may be discharged to the electronic device 150 connected to one end of the distribution board 120 during hours when demand for electricity surges or the electricity rate is high.

The power metering devices 171, 172, 173 and 174 may be connected to the output of the external power supply source 110, the input of the distribution board 120, the input of the ESS 140 and the output of the electronic device 150 connected to the ESS 140, respectively.

A first power metering device 171 connected to the output of the external power supply source 110 may include at least one module capable of measuring the power supplied from the external power supply source 110.

Further, the first power metering device 171 may include at least one module capable of measuring the total amount of power consumption of the loads and the ESS 140 and an overall power consumption pattern when the power from the external power supply source 110 is supplied to a plurality of loads such as the electronic devices 130 and 150 and the ESS 140.

Further, the first power metering device 171 may measure power consumption patterns of the respective loads and a power consumption pattern of the ESS 140. These power consumption patterns may be analyzed using the NILM algorithm. Thereby, the power consumption patterns may be used to acquire at least one of the amount of power consumed by each of the loads, operational status information about each of the loads, the amount of power consumed by the ESS 140 and operational status information about the ESS 140.

The second power metering device 172 connected to the input of the distribution board 120 may include at least one module capable of measuring the total amount of power consumption of a plurality of loads such as the electronic devices 130 and 150 and the ESS 140 and a consumption pattern of the whole power when power from the external power supply source 110 is supplied to the loads or the ESS 140.

The second power metering device 172 may also measure the power consumption patterns of the respective loads and the power consumption pattern of the ESS 140. Thereafter, the power consumption patterns of the loads may be analyzed using the NILM algorithm. Thereby, the power consumption patterns may be used to acquire at least one of the amount of power consumed by each of the loads, operational status information about each of the loads, the amount of power consumed by the ESS 140 and operational status information about the ESS 140.

A third power metering device 173 connected to the input of the ESS 140 may include at least one module capable of measuring the amount of power stored in the ESS 140 or the amount of power discharged from the ESS 140.

The third power metering device 173 may also include at least one module capable of measuring a power consumption pattern of the ESS 140. Thereafter, the power consumption pattern of the ESS 140 may be analyzed using the NILM algorithm. Thereby, the power consumption pattern of the ESS 140 may be used to acquire at least one of the amount of power stored in or discharged from the ESS 140 and operational status information about the ESS 140.

The third power metering device 173 may also measure the power consumption pattern of the electronic device 150 connected to the ESS 140. Thereafter, the power consumption pattern of the electronic device 150 may be analyzed using the NILM algorithm. Thereby, the power consumption pattern may be used to acquire at least one of the amount of power consumed by the electronic device 150 and operational status information about the electronic device 150.

The fourth power metering device 174 connected to the input of the electronic device 150 connected to the ESS 14 may measure the amount of power consumption of the electronic device 150 connected to the ESS 140. The fourth power metering device 174 may also measure the power consumption pattern of the electronic device 150 connected to the ESS 140. Thereafter, the power consumption pattern of the electronic device 150 may be analyzed using the NILM algorithm. Then, the power consumption pattern may be used to acquire at least one of the amount of power consumed by the electronic device 150 and the operational status information about the electric device 150.

Hereinafter, a detailed description will be given of a method for monitoring power consumed by loads based on the configuration of the power monitoring system including the power metering devices described above according to some embodiments of the present disclosure, with reference to FIGS. 12 to 19. Although the method for monitoring power described below is limited to a sequence of collecting data, it should be noted that the data may be collected from the respective power metering devices, irrespective of the sequence of collecting data.

FIGS. 12 to 19 are flowcharts illustrating methods for monitoring power in a power monitoring system according to some embodiments of the present disclosure.

Figure 12:
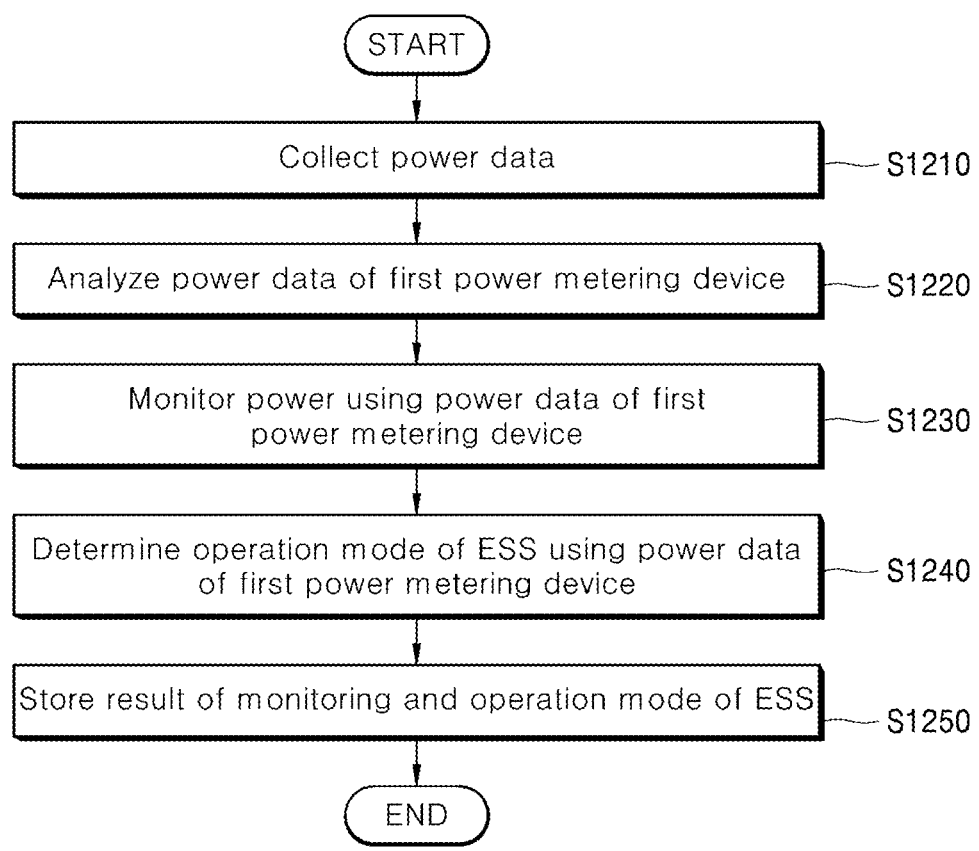
FIGS. 12 and 13 are flowcharts illustrating a method for monitoring power when an energy storage system operates in an AC PASS mode, according to some embodiments of the present disclosure.

FIG. 12 is a flowchart illustrating a method for monitoring power in the monitoring server 10 using first power data detected by the first power metering device when the ESS operates in an AC PASS mode.

Referring to FIG. 12, the monitoring server 10 may collect power data via the communication unit 11 (S1210). Specifically, the monitoring server 10 may receive first power data from the first power metering device 171 provided to the output of the external power supply source 110.

In the example of FIG. 11, the second power metering device 172 is provided to the input of the distribution board 120, the third power metering device 173 is provided to the input of the ESS 140, and the fourth power metering device 174 is provided to the input of the electric device 150. Since the second power data of the second power metering device 172, the third power data of the third power metering device 173 and the fourth power data of the fourth power metering device 174 can be estimated based on the first power data, power may be monitored without using the second, third and fourth power data in some embodiments.

The controller 12 of the monitoring server 10 may analyze the first power data of the first power metering device 171 collected via the communication unit 11 (S1220).

In this case, the first power data may include information about the amount of power applied from the external power supply source 110.

The first power data may also include the total amount of power consumption of the plurality of electronic devices 130, the ESS 140 and the electronic device 150 connected to the ESS 140 and a total power consumption pattern thereof.

Further, the first power data may include power consumption patterns of the individual electronic devices constituting the plurality of electronic devices 130, the power consumption pattern of the ESS 140, or the power consumption pattern of electronic device 150 connected to the ESS 140.

The controller 12 of the monitoring server 10 may monitor power of the system based on the first power data detected by the first power metering device 171 (S1230).

Specifically, the controller 12 may acquire the amount of power applied from the external power supply source 110 using the first power data detected by the first power metering device 171. The controller 12 may also acquire at least one of the amount of power consumption of each individual electronic device constituting the plurality of electronic devices 130 and the operational status information about the individual electronic devices, using the first power data detected by the first power metering device 171. The controller 12 may also acquire at least one of the amount of power consumption of the electronic device 150 connected to the ESS 140 and the operational status information, using the first power data detected by the first power metering device 171. In this case, the NILM algorithm may be used.

The controller 12 of the monitoring server 10 may determine the operational status of the ESS 140, using the first power data detected by the first power metering device 171 (S1240). Specifically, when the ESS 140 is in the AC PASS mode, the ESS 140 neither stores nor discharges power. According, when detecting this state, the controller 12 may determine that the operational status of the ESS 140 is the AS PASS mode.

While it is illustrated in some embodiments that an operational mode of the ESS is determined after the power in the system is monitored, embodiments of the present disclosure are not limited thereto. Specifically, if the ESS 140 neither stores nor discharges power, the controller 12 may determine the operational status of the ESS 140 is the AC PASS mode based on the first power data. Thereafter, the controller 12 may monitor the power in the system according to the algorithm of FIG. 12.

The controller 12 may store, in the storage unit 13, the first power data, the result of monitoring acquired using the first power data and the operational status information about the ESS 140 (S1250).

Figure 13:
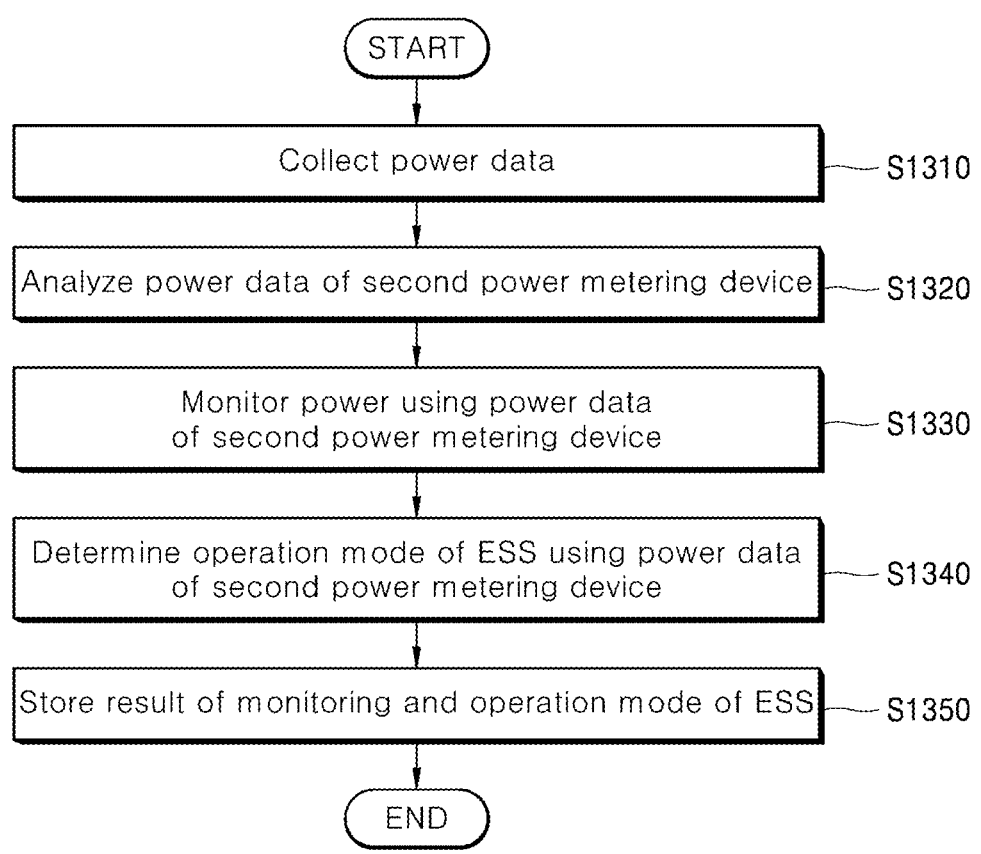

FIG. 13 is a flowchart illustrating a method for monitoring power in the monitoring server 10 using the second power data detected by the second power metering device when the ESS 140 operates in the AC PASS mode.

In some embodiments, the second power data measured by the second power metering device 172 may include the same value as the first power data measured by the first power metering device 171. Accordingly, details of the method for monitoring power using the first power data of FIG. 12 may be applied to the method for monitoring power using the second power data as illustrated in FIG. 13.

Figure 14:
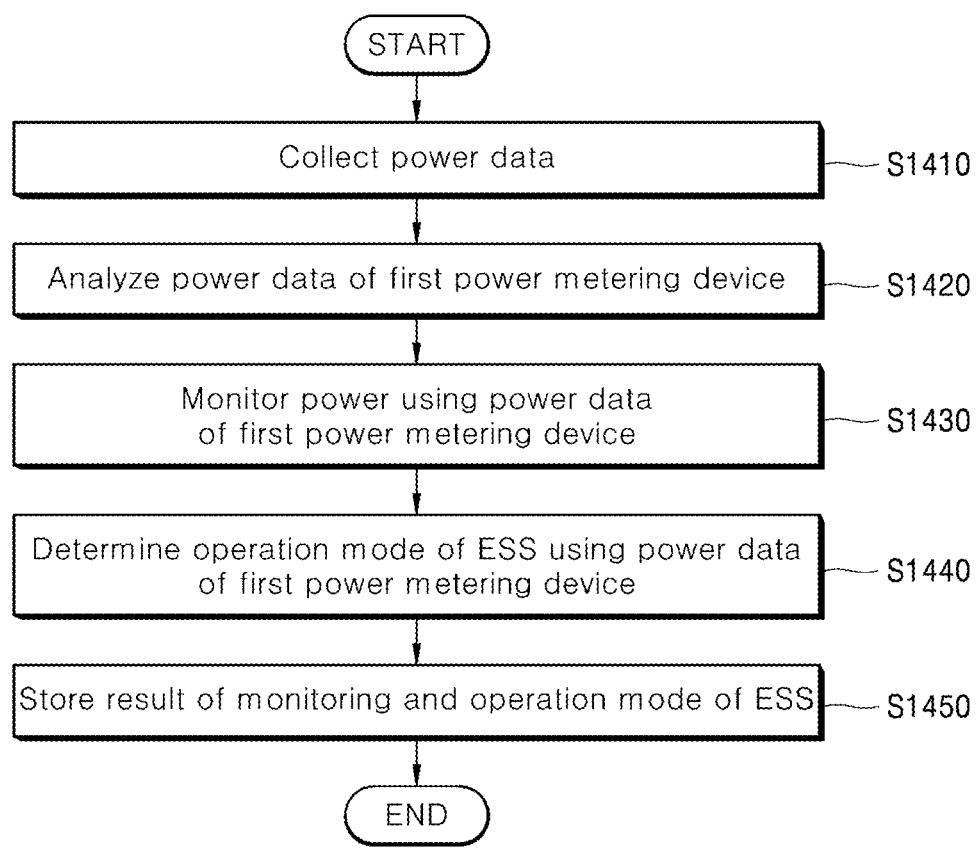
FIGS. 14 and 15 are flowcharts illustrating a method for monitoring power when an energy storage system operates in a charge mode, according to some embodiments of the present disclosure.

FIG. 14 is a flowchart illustrating a method for monitoring power in the monitoring server 10 using first power data detected by the first power metering device, when the ESS operates in a charge mode.

Referring to FIG. 14, the monitoring server 10 may collect power data via the communication unit 11 (S1410). Specifically, the monitoring server 10 may receive power data from the first power metering device 171 provided to the output of the external power supply source 110.

In the example of FIG. 11, the second power metering device 172 is provided to the input of the distribution board 120, the third power metering device 173 is provided to the input of the ESS 140, and the fourth power metering device 174 is provided to the input of the electronic device 150. Since the second power data of the second power metering device 172, the third power data of the third power metering device 173 and the fourth power data of the fourth power metering device 174 can be estimated based on the first power data, power may be monitored without using the second, third and fourth power data in some embodiments.

The controller 12 of the monitoring server 10 may analyze the first power data of the first power metering device 171 collected via the communication unit 11 (S1420).

In this case, the first power data may include information about the amount of power applied from the external power supply source 110.

The first power data may include the total amount of power consumption of the plurality of electronic devices 130, the ESS 140 and the electronic device 150 connected to the ESS 140 and a total power consumption pattern.

Further, the first power data may include power consumption patterns of the individual electronic devices constituting the plurality of electronic devices 130 and the power consumption pattern of the ESS 140. Further, the first power data may include the power consumption pattern of the electronic device 150 connected to the ESS 140. In some embodiments, the ESS 140 operates in the charge mode, and thus the amount of power consumption of the electronic device 150 is 0.

The controller 12 of the monitoring server 10 may monitor power of the system based on the first power data detected by the first power metering device 171 (S1430).

Specifically, the controller 12 may acquire the amount of power applied from the external power supply source 110 using the first power data detected by the first power metering device 171. The controller 12 may also acquire at least one of the amount of power consumption of each individual electronic device constituting the plurality of electronic devices 130 and the operational status information about the individual electronic devices, using the first power data detected by the first power metering device 171. The controller 12 may also acquire at least one of the amount of power consumed by the ESS 140 and the operational status information, using the first power data detected by the first power metering device 171. In this case, the NILM algorithm may be used.

The controller 12 of the monitoring server 10 may determine the operational status of the ESS 140, using the first power data detected by the first power metering device 171 (S1440). Specifically, the first power data may include the power consumption pattern of the ESS 140. Accordingly, the controller 12 may determine that the ESS 140 operates in the charge mode, by analyzing the power consumption pattern of the ESS 140.

While it is illustrated in some embodiments that an operational mode of the ESS is determined after the power in the system is monitored, embodiments of the present disclosure are not limited thereto. Specifically, the controller 12 may determine that the operational status of the ESS 140 is the charge mode, using the first power data. Thereafter, the controller 12 may monitor the power in the system according to the algorithm of FIG. 14.

The controller 12 may store, in the storage unit 13, the first power data, the result of monitoring acquired using the first power data and the operational status information about the ESS 140 (S1450).

Figure 15:
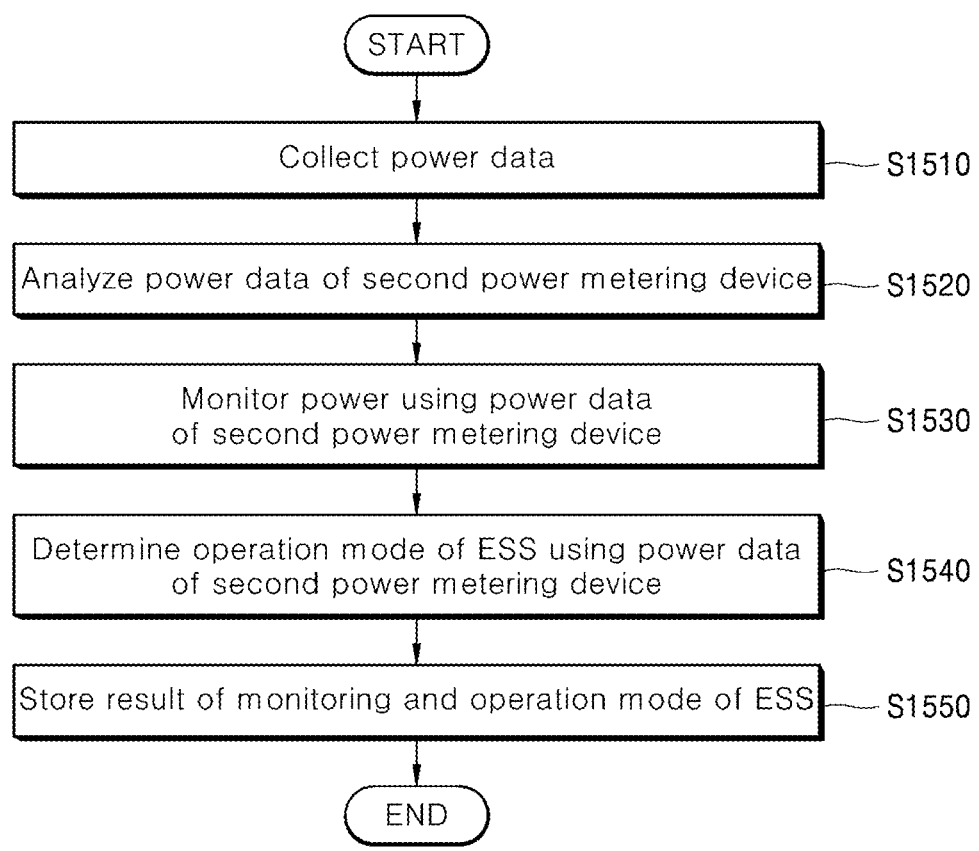

FIG. 15 is a flowchart illustrating a method for monitoring power in the monitoring server 10 using second power data detected by the second power metering device when the ESS operates in the charge mode.

In some embodiments, the second power data measured by the second power metering device 172 may include the same value as the first power data measured by the first power metering device 171. Accordingly, details of the method for monitoring power using the first power data of FIG. 14 may be applied to the method for monitoring power using the second power data as illustrated in FIG. 15.

Figure 16:
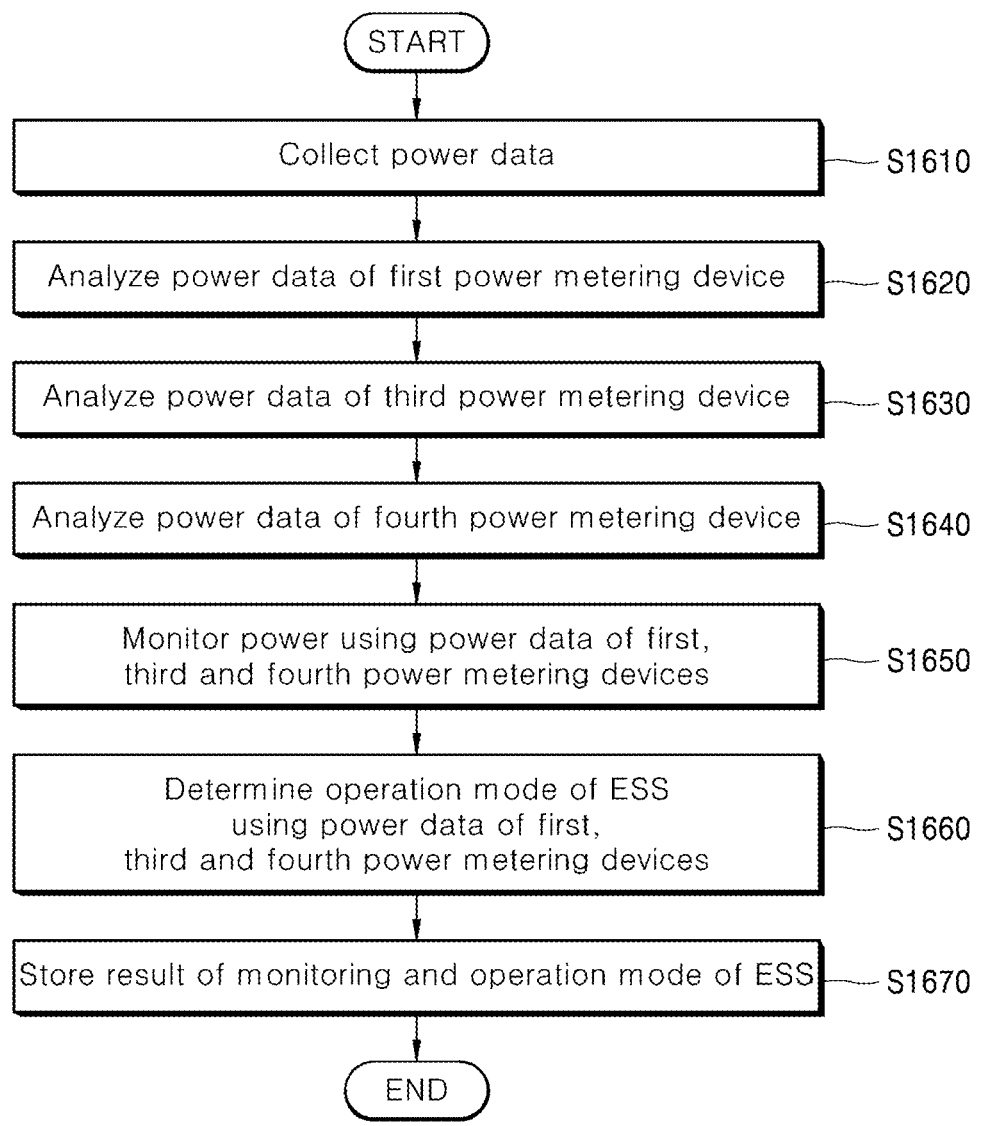
FIGS. 16 and 17 are flowcharts illustrating a method for monitoring power when an energy storage system operates in a discharge mode, according to some embodiments of the present disclosure.

FIG. 16 is a flowchart illustrating a method for monitoring power in the monitoring server 10 using first power data detected by the first power metering device, third power data detected by the third power metering device, and fourth power data detected by the fourth power metering device when the ESS operates in the discharge mode (as a power generation source).

Referring to FIG. 16, the monitoring server 10 may collect power data from the first power metering device 171, the third power metering device 173 and the fourth power metering device 174 via the communication unit 11 (S1610).

In FIG. 11, the second power metering device 172 is illustrated as being provided to the input of the distribution board 120. However, since the second power data of the second power metering device 172 can be estimated based on the first power data, third power data and fourth power data, power may be monitored without using the second power data in some embodiments.

The controller 12 of the monitoring server 10 may analyze the first power data of the first power metering device 171 collected via the communication unit 11 (S1620).

In this case, the first power data may include information about the amount of power applied from the external power supply source 110. The first power data may also include power consumption patterns of the individual electronic devices constituting the plurality of electronic devices 130.

The controller 12 of the monitoring server 10 may analyze the third power data of the third power metering device 173 collected via the communication unit 11 (S1630).

In this case, the third power data may include information about the amount of power applied to the ESS 140.

The controller 12 of the monitoring server 10 may analyze the fourth power data of the fourth power metering device 174 collected via the communication unit 11 (S1640).

In this case, the fourth power data may include information about the amount of power consumption of the electronic device 150 connected to the ESS 140 or the power consumption pattern of the electronic device 150 connected to the ESS 140.

The controller 12 of the monitoring server 10 may monitor the power of the whole system, using the first power data detected by the first power metering device 171, the third power data detected by the third power metering device 173 and the fourth power data detected by the fourth power metering device 174 (S1650).

Specifically, the controller 12 may acquire the amount of power applied from the external power supply source 110 using the first power data detected by the first power metering device 171. The controller 12 may also acquire at least one of the amounts of power consumption of individual electronic devices constituting the plurality of electronic devices 130 and the operational status information about the individual electronic devices, using the first power data detected by the first power metering device 171. The controller 12 may also acquire the amount of power consumption of the electronic device 150 connected to the ESS 140, using the fourth power data detected by the fourth power metering device 174. The controller 12 may acquire the amount of discharge of the ESS 140 by subtracting the amount of power consumption of the electronic device 150 connected to the ESS 140 included in the fourth power data from the amount of power applied to the ESS 140 included in the third power data. In this case, the NILM algorithm may be used.

The controller 12 of the monitoring server 10 may determine the operational status of the ESS 140 using the third power data and fourth power data (S1660). Specifically, if the value obtained by subtracting the amount of power consumption of the electronic device 150 connected to the ESS 140 included in the fourth power data from the amount of power applied to the ESS 140 included in the third power data is positive, the controller 12 may determine that the ESS 140 is in the discharge mode, namely the ESS 140 operates as a power generation source.

While it is illustrated in some embodiments that an operational mode of the ESS is determined after the power in the system is monitored, embodiments of the present disclosure are not limited thereto. Specifically, the controller 12 may determine that the operational status of the ESS 140 is the discharge mode, using the third power data and fourth power data. Thereafter, the controller 12 may monitor the power in the system according to the algorithm of FIG. 16.

The controller 12 may store, in the storage unit 13, the first, third and fourth power data, the result of monitoring acquired using the first, third and fourth power data, and the operational status information about the ESS 140 (S1670).

Figure 17:
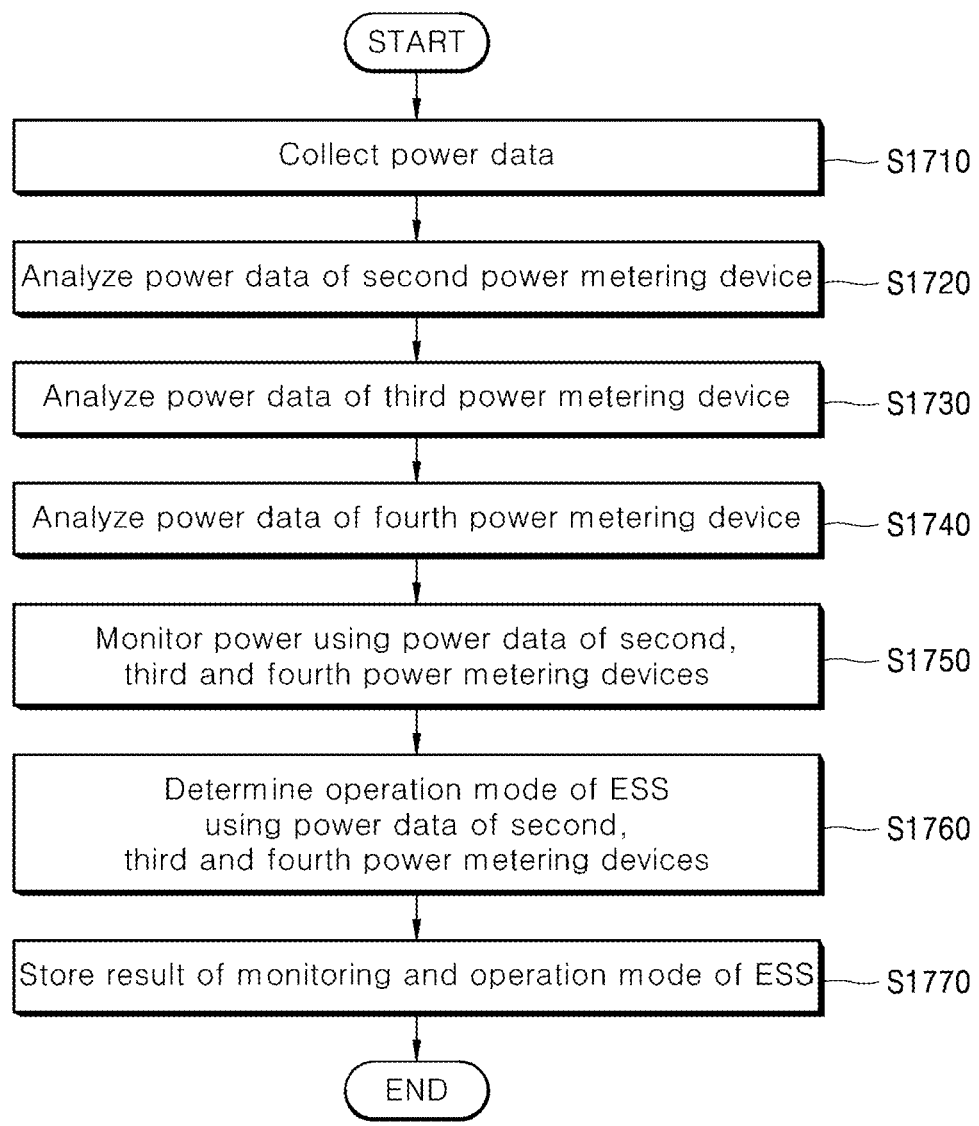

FIG. 17 is a flowchart illustrating a method for monitoring power in the monitoring server 10 using second power data detected by the second power metering device, third power data detected by the third power metering device, and fourth power data detected by the fourth power metering device when the ESS 140 operates in the discharge mode (as a power generation source).

In some embodiments, the second power data measured by the second power metering device 172 may include the same value as the first power data measured by the first power metering device 171. Accordingly, details of the method for monitoring power using the first, third and fourth power data of FIG. 16 may be applied to the method for monitoring power using the second, third and fourth power data.

Figure 18:
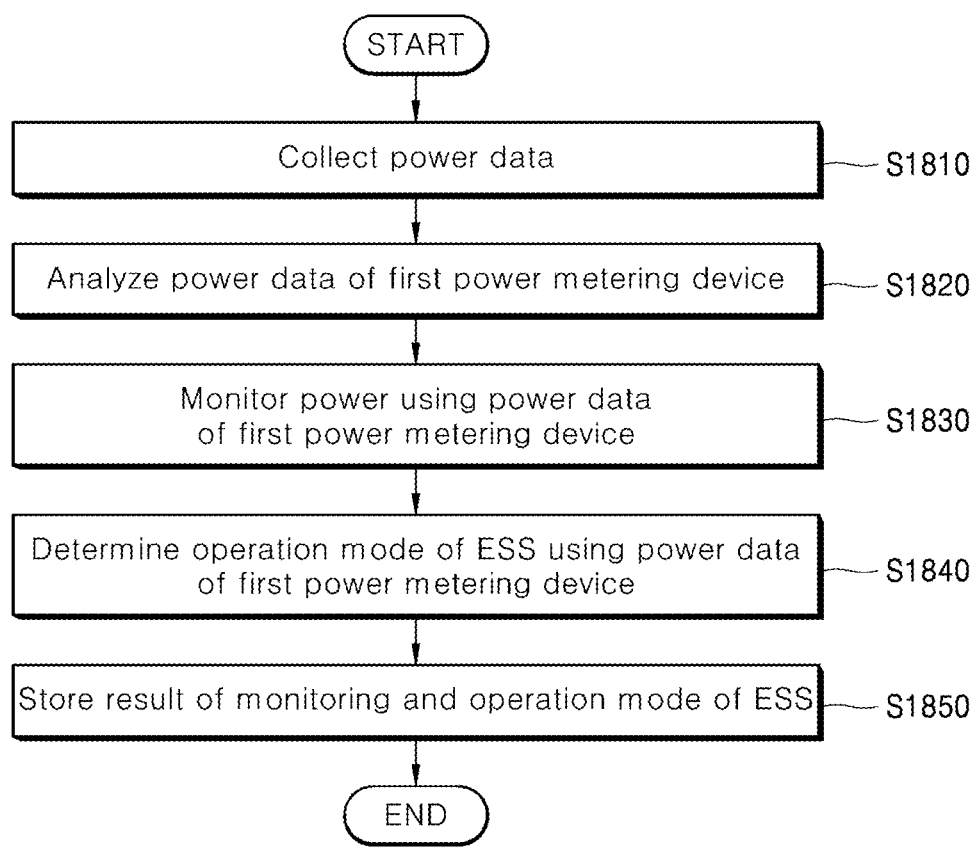
FIGS. 18 and 19 are flowcharts illustrating a method for monitoring power when an energy storage system operates in a charge mode and an AC PASS mode, according to some embodiments of the present disclosure.

FIG. 18 is a flowchart illustrating a method for monitoring power in the monitoring server 10 using the first power data detected by the first power metering device when the ESS 140 operates in the charge and AC PASS modes.

Referring to FIG. 18, the monitoring server 10 may collect the first power data from the first power metering device via the communication unit 11 (S1810).

In FIG. 11, the second power metering device 172 is illustrated as being provided to the input of the distribution board 120, the third power metering device 173 is provided to the input of the ESS 140, and the fourth power metering device 174 is illustrated as being provided to the input of the electronic device 150 connected to the ESS 140. Since the second power data of the second power metering device 172, the third power data of the third power metering device 173 and the fourth power data of the fourth power metering device 174 can be estimated based on the first power data, power may be monitored without using the second power data, third power data and fourth power data in some embodiments.

The controller 12 of the monitoring server 10 may analyze the first power data of the first power metering device 171 collected via the communication unit 11 (S1820).

In this case, the first power data may include information about the amount of power supplied from the external power supply source 110.

The first power data may also include the total amount of power consumption of the plurality of electronic devices 130, the ESS 140 and the electronic device 150 connected to the ESS 140 and a total power consumption pattern.

The first power data may also include power consumption patterns of the individual electronic devices constituting the plurality of electronic devices 130, the ESS 140 and the electronic device 150 connected to the ESS 140.

The controller 12 of the monitoring server 10 may monitor the power of the whole system using the first power data detected by the first power metering device 171 (S1830).

Specifically, the controller 12 may acquire information about the amount of power supplied from the external power supply source 110 using the first power data detected by the first power metering device 171. The controller 12 may also acquire information about the amount of power consumed by each individual electronic device constituting the plurality of electronic devices 130 or the operational statuses of the individual electronic devices using the first power data. The controller 12 may also acquire information about the amount of power consumed by (namely, stored in) the ESS 140, using the first power data. The controller 12 may also acquire information about the amount of power consumed by the electronic device 150 connected to the ESS 140, using the first power data. In this case, the NILM algorithm may be used.

The controller 12 of the monitoring server 10 may determine the operational status of the ESS 140, using the first power data (S1840). Specifically, the controller 12 determines whether the ESS 140 operates in the charge mode by analyzing the power usage pattern of the ESS 140 included in the first power data. Then, the controller 12 determines whether the electronic device 150 consumes power by analyzing the power usage pattern of the electronic device 150, which is connected to the ESS, included in the first power data. Thereby, the controller 12 may determine whether the ESS 140 operates in the charge and AC PASS modes.

While it is illustrated in some embodiments that an operational mode of the ESS is determined after the power in the system is monitored, embodiments of the present disclosure are not limited thereto. Specifically, after the controller 12 determines that the operational status of the ESS 140 is the charge and AC PASS modes, using the first power data, the controller 12 may monitor the power in the system according to the algorithm of FIG. 18.

In some embodiments, the second power data measured by the second power metering device 172 may include the same value as the first power data measured by the first power metering device 171. Accordingly, the method for monitoring power using the first power data according to some embodiments may also be implemented with a method for monitoring power using the second power data in place of the first power data.

Figure 19:
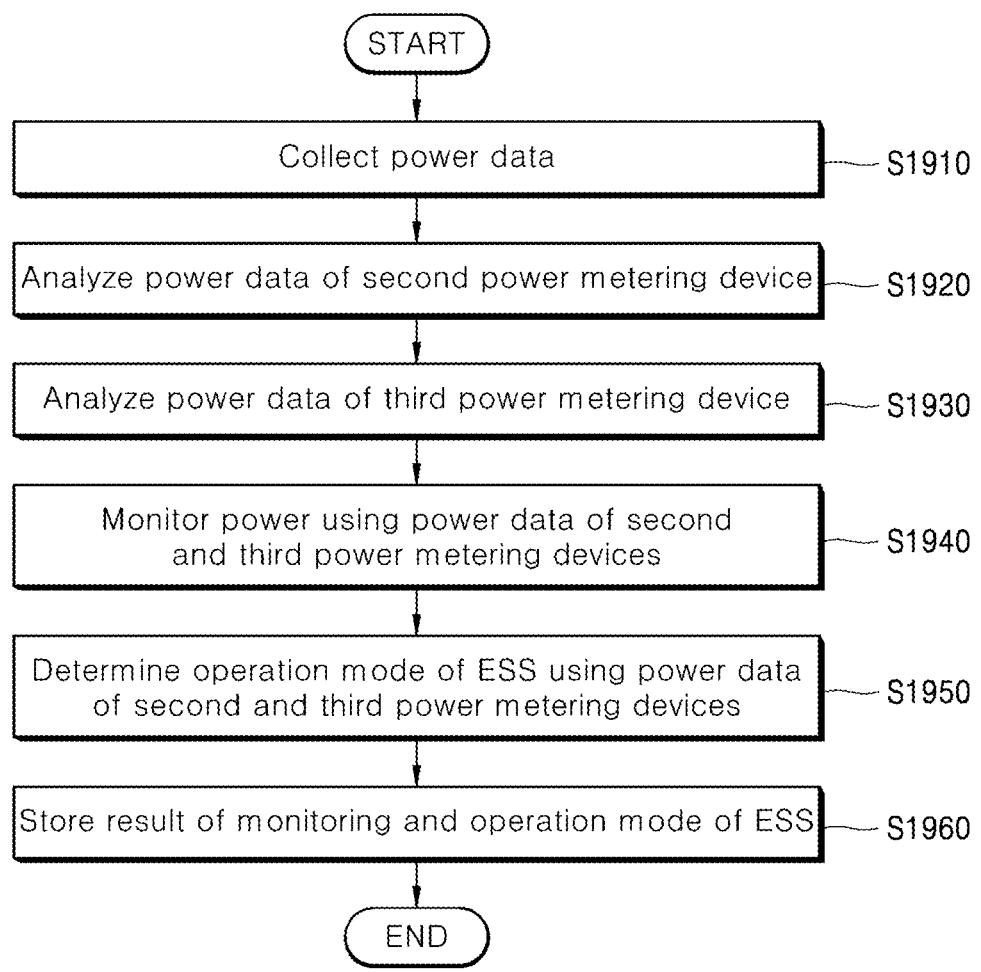

FIG. 19 is a flowchart illustrating a method for monitoring power in the monitoring server 10 using second power data detected by the second power metering device and third power data detected by the third power metering device when the ESS 140 operates in the charge and AC PASS modes.

Referring to FIG. 19, the monitoring server 10 may collect second power data from the second power metering device 172 and third power data from the third power metering device 173 via the communication unit 11 (S1910).

In FIG. 11, the first power metering device 171 is illustrated as being provided to the output of the external power supply source, and the fourth power metering device 174 is illustrated as being provided to the input of the electronic device 150. Since the power data of the first power metering device 171 and the power data of the fourth power metering device 174 can be estimated based on the second power data of the second power metering device 172 and the third power data of the third power metering device 173, power may be monitored without using the first and fourth power data in some embodiments.

The controller 12 of the monitoring server 10 may analyze the second power data of the second power metering device 172 collected via the communication unit 11 (S1920).

In this case, the second power data may include the amount of power applied to the distribution board 120.

Further, the second power data may include the total amount of power consumption of the plurality of electronic devices 130, a total power consumption pattern of the plurality of electronic devices 130 and power consumption patterns of the individual electronic devices constituting the plurality of electronic devices 130.

The controller 12 of the monitoring server 10 may analyze the third power data of the third power metering device 173 collected via the communication unit 11 (S1930).

In this case, the third power data may include the total amount of power consumption of the ESS 140 and the electronic device 150 connected to the ESS 140.

The third power data may also include information about the power consumption pattern of the ESS 140 or the power consumption pattern of the electronic device 150 connected to the ESS 140.

the controller 12 of the monitoring server 10 may monitor the power of the whole system, using the second power data detected by the second power metering device 172 and the third power data detected by the third power metering device 173 (S1940).

Specifically, the controller 12 may acquire at least one of the total amount of power consumption of the plurality of electronic devices 130, the amount of power consumption of each individual electronic device, and operational status information about the individual electronic devices, using the second power data. The controller 12 may also acquire information about the amount of power consumption of the ESS 140 (namely, the amount of charge of the ESS 140) and the amount of power consumption of the electronic device 150 connected to the ESS 140, using the third power data. In this case, the NILM algorithm may be used.

The controller 12 may also acquire information about the amount of power supplied from the external power supply source 110, using the second power data and third power data. Specifically, the controller 12 may acquire information about the amount of power supplied from the external power supply source 110 by adding the total amount of power consumption of the plurality of electronic devices 130 acquired using the second power data to the amount of power consumption of the ESS 140 and the electronic device 150 acquired using the third power data.

The controller 12 of the monitoring server 10 may determine the operational status of the ESS 140, using the third power data detected by the third power metering device 173 (S1950). Specifically, the controller 12 may analyze the power consumption pattern of the ESS 140 included in the third power data. If the ESS 140 and the electronic device 150 connected to the ESS are consuming power, the controller 12 may determine that the ESS 140 operates in the charge and AC PASS modes.

While it is illustrated in some embodiments that an operational mode of the ESS is determined after the power in the system is monitored, embodiments of the present disclosure are not limited thereto. Specifically, the controller 12 may determine that the operational status of the ESS 140 is the charge and AC PASS modes, using the third power data. Thereafter, the controller 12 may monitor the power in the system according to the algorithm of FIG. 19.

The controller 12 may store, in the storage unit 13, at least one of the second and third power data, the result of monitoring acquired using the second and third power data and the operational status information about the ESS 140 (S1960).

In this way, the amount of power supplied from the external power supply source 110, the amounts of charge and discharge of the ESS 140, the total amount of power consumption of the plurality of electronic devices 130, the amounts of power consumed by the individual electronic devices, and operational status information about the individual electronic devices may all be obtained using the first power metering device 171, the second power metering device 172, the third power metering device 173 and the fourth power metering device 174. According, it is possible to comprehensively monitor power production and consumption.

Further, with some embodiments of the present disclosure, it is possible to estimate the amount of power supplied from the external power supply source 110 and the amount of power used by the ESS 140 even if one or more of the first power metering device 171, the second power metering device 172, the third power metering device 173 and the fourth power metering device 174 are not provided. Accordingly, it is possible to comprehensively monitor power production and consumption irrespective of malfunction or maintenance of any of the plurality of power metering devices.

Further, as the first power metering device 171, the second power metering device 172, the third power metering device 173 and the fourth power metering device 174 are all used, the power in the system may be monitored with a minimized error.

Figure 21:
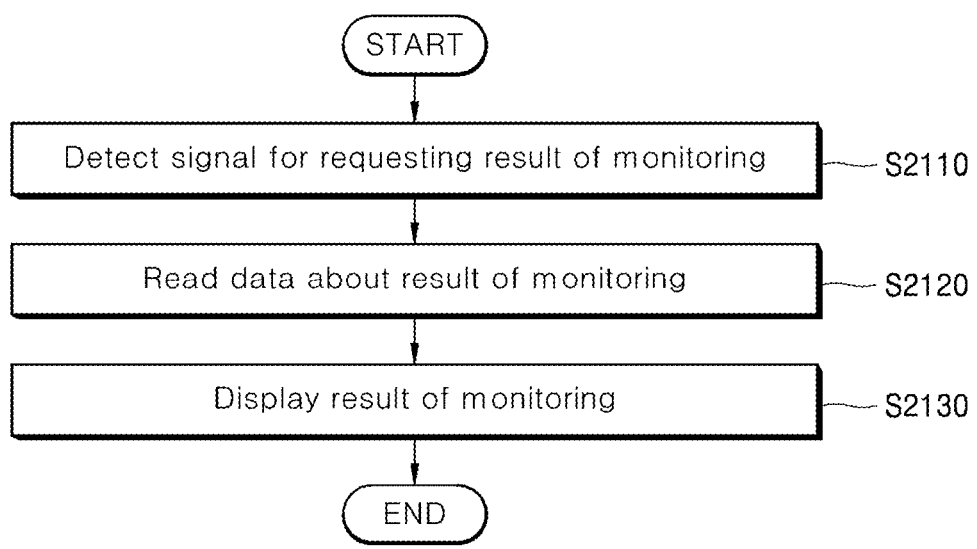
FIG. 21 is a flowchart illustrating an operation of outputting a result of power monitoring according to some embodiments of the present disclosure.
Figure 22:
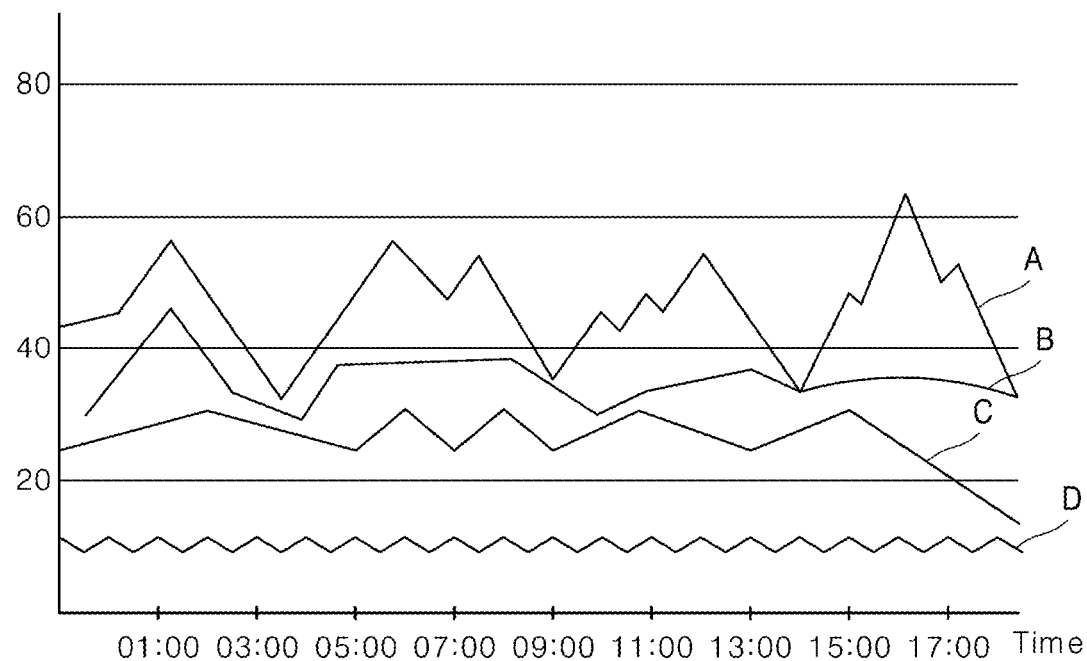
FIG. 22 shows output of the result of power monitoring according to some embodiments of the present disclosure.

FIG. 21 is a flowchart illustrating an operation of outputting a result of power monitoring according to some embodiments of the present disclosure, and FIG. 22 shows output of the result of power monitoring according to some embodiments of the present disclosure.

Hereinafter, a detailed description will be given of an operation of outputting a result of power monitoring stored in the storage unit 13 of the monitoring server 10 according to some embodiments of the present disclosure, with reference to FIGS. 21 and 22.

Referring to FIGS. 21 and 22, the controller 12 of the monitoring server 10 may detect a signal for requesting output of the result of monitoring measured, obtained and stored in the storage unit 13 in accordance with some embodiments of the present disclosure (S2110). The output request signal may be input through a user input unit (not shown) or received from a remote terminal in a wired or wireless manner.

The controller 12 of the monitoring server 10 may extract the result of monitoring stored in the storage unit 13 (S2120), and display power data in various forms such as graphs, numerals and texts as shown in FIG. 21 (S2130). FIG. 22 depicts information about the amount of power consumption or amount of charge electronic devices and ESS. In the example, A to C represent an example of the amounts of power of the home appliances 130, and D represents an example of the amount of power of the ESS 140. For the amounts of power of home appliances, the cycle of the amounts of power may be short as the power data required for NILM analysis are detected.

In some embodiments of the present disclosure, the operations for measuring or estimating power data in the external power supply source 110, the distribution board 120, the electronic devices 130, and the ESS 140 are described in a sequential order. However, it should be noted that order of the operations for estimating or measuring the aforementioned power data is not limited thereto, and may be varied in various forms and performed.

According to some embodiments of the present disclosure, as an ESS is provided in addition to a conventional external power supply source, the consumption state of power supplied to the loads and the power production state of a renewable energy source may be comprehensively monitored.

While the embodiments of the present disclosure have been shown and described, it should be noted that the spirit of the present disclosure is not limited to the specific embodiments described above. Those skilled in the art will appreciate that various changes and modifications can be made to the disclosure, without departing from the scope and spirit of the present disclosure as defined in the accompanying claims. It should be noted that the aforementioned changes and modifications shall not be understood individually as being different from the spirit or prospects of the present disclosure. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A power monitoring system comprising:
    an external power supply source configured to apply power;
    a distribution board configured to distribute power applied from the external power supply source to a first load;
    an energy storage system (ESS) configured to store the power applied from the external power supply source and to discharge the stored power to the distribution board, wherein the ESS is further configured to operate in one of a charge mode, a mode in which AC current is passed (AC PASS mode), a charge and AC PASS mode, or a discharge mode, and wherein a second load is connected to the ESS for receiving power from the ESS;

a first power metering device connected to an output of the external power supply source and configured to determine first power data applied from the external power supply source;

a second power metering device connected to an input of the distribution board and configured to determine second power data distributed from the distribution board to the first load;

a third power metering device connected to an input of the ESS and configured to determine third power data applied to the ESS; and a server configured to monitor power based on at least one of the first power data, the second power data, or the third power data when the ESS operates in one of the charge mode, the AC PASS mode, the charge and AC PASS mode, or the discharge mode, wherein, the power from the external power supply source is applied to the second load connected to the ESS via the distribution board and the ESS, wherein, if the ESS is being charged and the second load is consuming power, the server is configured to determine that an operational status of the ESS is the charge and AC PASS mode, using a power consumption pattern of the ESS and a power consumption pattern of the second load contained in one of the first power data or the third power data.

2. The power monitoring system according to claim 1, wherein the first power data comprises a power consumption pattern of at least one of the first load, the ESS, or the second load, wherein the server is further configured to acquire at least one of an amount of power consumed by the first load, an amount of power consumed by the ESS, or the amount of power consumed by the second load by analyzing the first power data using a non-intrusive load monitoring (NILM) algorithm.

3. The power monitoring system according to claim 1, wherein the second power data comprises a power consumption pattern of the first load, wherein the server is further configured to acquire an amount of power consumed by the first load by analyzing the second power data using a non-intrusive load monitoring (NILM) algorithm.

4. The power monitoring system according to claim 1, wherein the third power data comprises at least one of the power consumption pattern of the ESS or the power consumption pattern of the second load, wherein the server is further configured to acquire at least one of an amount of power consumed by the second load or an amount of power consumed by the ESS by analyzing the third power data using a non-intrusive load monitoring (NILM) algorithm.

5. The power monitoring system according to claim 1, wherein, if the ESS is neither storing nor discharging power, the server is further configured to:
  determine that the operational status of the ESS is the AC PASS mode, using the power consumption pattern of the ESS contained in the first power data or the third power data; and
  monitor power using one of the first power data, or the second power data and the third power data.

6. The power monitoring system according to claim 1, wherein, if the ESS consumes power, the server is further configured to:
  determine that the operational status of the ESS is the charge mode, using the power consumption pattern of the ESS contained in the first power data or third power data; and
  monitor power using one of the first power data, or the second power data and the third power data.

7. The power monitoring system according to claim 1, wherein the server is further configured to determine that the operational status of the ESS is the discharge mode if:
  an amount of power consumption of the first load contained in the second power data is larger than an amount of power applied from the external power supply source contained in the first power data; or
  power applied to the ESS contained in the third power data is negative, wherein the server is further configured to monitor power using one of the first power data and the second power data or the second power data and the third power data.

8. A power monitoring system comprising:
  an external power supply source configured to apply power;
  a distribution board configured to distribute power applied from the external power supply source to at least one of a first load or an energy storage system (ESS), wherein the ESS is connected to an output of the distribution board and is configured to store the power distributed from the distribution board and to discharge the stored power, wherein the ESS is further configured to operate in one of a charge mode, a mode in which AC current is passed (AC PASS mode), a charge and AC PASS mode, or a discharge mode, and wherein a second load is connected to the ESS for receiving power from the ESS;
  a first power metering device connected to an output of the external power supply source and being configured to determine first power data applied from the external power supply source;
  a second power metering device connected to an input of the distribution board and being configured to determine second power data distributed from the distribution board to at least one of the first load or the ESS;
  a third power metering device connected to an input of the ESS and configured to determine third power data applied to the ESS;
  a fourth power metering device configured to detect fourth power data applied to the second load; and
  a server configured to monitor power based on at least one of the first power data, the second power data, the third power data or the fourth power data when the ESS operates in one of the charge mode, the AC PASS mode, the charge and AC PASS mode, or the discharge mode,
  wherein, if the ESS is being charged, the server is further configured to determine that an operational status of the ESS is the charge mode, using a power consumption pattern of the ESS contained in one of the first power data or the second power data, and to further monitor power using at least one of the first power data or the second power data, and
  the power from the external power supply source is applied to the second load connected to the ESS via the distribution board and the ESS,
  wherein, if the ESS is being charged and the second load is consuming power, the server is configured to determine that the operational status of the ESS is the charge and AC PASS mode, using the power consumption pattern of the ESS and a power consumption pattern of the second load contained in one of the first power data or the third power data.

9. The power monitoring system according to claim 8, wherein each of the first power data and the second power data comprises a power consumption pattern of at least one of the first load, the ESS, or the second load, wherein the server is further configured to acquire at least one of an amount of power consumed by the first load, an amount of power consumed by the ESS, or an amount of power consumed by the second load by analyzing one of the first power data or the second power data using a non-intrusive load monitoring (NILM) algorithm.

10. The power monitoring system according to claim 8, wherein the third power data comprises at least one of the power consumption pattern of the ESS or the power consumption pattern of the second load, wherein the server is further configured to acquire at least one of an amount of power consumed by the second load or an amount of power consumed by the ESS by analyzing the third power data using a non-intrusive load monitoring (NILM) algorithm.

11. The power monitoring system according to claim 8, wherein the fourth power data comprises the power consumption pattern of the second load, wherein the server is further configured to acquire an amount of power consumed by the second load by analyzing the fourth power data using a non-intrusive load monitoring (NILM) algorithm.

12. The power monitoring system according to claim 8, wherein, if the ESS is neither storing nor discharging power, the server is further configured to determine that the operational status of the ESS is the AC PASS mode, using the power consumption pattern of the ESS contained in the first power data or the second power data, and to further monitor power using at least one of the first power data or the second power data.

13. The power monitoring system according to claim 8, wherein, if an amount of power consumption of the second load contained in the fourth power data is larger than an amount of power applied to the ESS contained in the third power data, the server is further configured to determine that the operational status of the ESS is the discharge mode, and to further monitor power using one of the first power data, the third power data, and the fourth power, or the second power data, the third power data, and the fourth power data.

* * * * *